(12) United States Patent
Hwang et al.

(10) Patent No.: US 10,795,483 B2
(45) Date of Patent: Oct. 6, 2020

(54) TOUCH DISPLAY DEVICE, TOUCH CIRCUIT, AND DRIVING METHOD

(71) Applicant: LG DISPLAY CO., LTD., Seoul (KR)

(72) Inventors: KwangJo Hwang, Gyeonggi-Do (KR); HwiDeuk Lee, Gyeongsangbuk-Do (KR); Yangsik Lee, Gyeonggi-Do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/505,057

(22) Filed: Jul. 8, 2019

(65) Prior Publication Data
US 2020/0026383 A1 Jan. 23, 2020

(30) Foreign Application Priority Data
Jul. 20, 2018 (KR) .................. 10-2018-0084689

(51) Int. Cl.
*G06F 3/041* (2006.01)
*G06F 3/044* (2006.01)
*H01L 27/32* (2006.01)

(52) U.S. Cl.
CPC .......... *G06F 3/0412* (2013.01); *G06F 3/0443* (2019.05); *G06F 3/04162* (2019.05); *G06F 3/04166* (2019.05); *G06F 2203/04112* (2013.01); *H01L 27/323* (2013.01)

(58) Field of Classification Search
CPC ...... G06F 3/044; G06F 3/0412; G06F 3/0416; G06F 3/0418; G06F 3/04184; G06F 2203/04111; G02F 1/13338; G02F 1/1343; G02F 2201/121; G02F 2201/123; G09G 3/3655; G09G 3/3674; G09G 3/3685; G09G 2320/0266; G09G 2310/027; H01L 27/323
See application file for complete search history.

(56) References Cited

U.S. PATENT DOCUMENTS

| | | | |
|---|---|---|---|
| 2011/0074446 A1 | 3/2011 | Chou et al. | |
| 2012/0146920 A1* | 6/2012 | Lin | G06F 3/0418 345/173 |
| 2013/0127773 A1 | 5/2013 | Kwon et al. | |
| 2013/0241873 A1 | 9/2013 | Kim et al. | |
| 2016/0364061 A1* | 12/2016 | Zhao | G02F 1/13338 |
| 2017/0293395 A1* | 10/2017 | Kim | G06F 3/044 |
| 2017/0344173 A1* | 11/2017 | Tang | G06F 3/0414 |
| 2018/0004345 A1 | 1/2018 | Shin et al. | |
| 2018/0059855 A1 | 3/2018 | Gwon et al. | |

FOREIGN PATENT DOCUMENTS

| | | |
|---|---|---|
| CN | 107797687 A | 3/2018 |
| JP | 2010-108501 A | 5/2010 |
| JP | 2015-111318 A | 6/2015 |
| KR | 10-2012-0115943 A | 10/2012 |

* cited by examiner

*Primary Examiner* — Dong Hui Liang
(74) *Attorney, Agent, or Firm* — Birch, Stewart, Kolasch & Birch, LLP

(57) ABSTRACT

Discussed is a touch display device having a touch circuit that includes an operational amplifier having a first input terminal for inputting a reference voltage, a second input terminal connected to a sensing target touch electrode, and an output terminal for outputting an output voltage, and wherein a common voltage applied to a common electrode and a reference voltage inputted to the first input terminal of the operational amplifier are synchronized with each other.

31 Claims, 36 Drawing Sheets

VREF ―――――

VTX ―――――

VPEN

VSS 
VREF 
VTX 
VPEN

TOUCH DISPLAY DEVICE, TOUCH CIRCUIT, AND DRIVING METHOD

CROSS REFERENCE TO RELATED APPLICATION

This application claims priority from Korean Patent Application No. 10-2018-0084689, filed on Jul. 20, 2018 in the Republic of Korea, which is hereby incorporated by reference for all purposes as if fully set forth herein.

BACKGROUND OF THE INVENTION

1. Field of the Invention

The present disclosure relates to a touch display device, a touch circuit and a method for driving the touch display device and the touch circuit.

2. Description of the Background Art

The touch display device can provide a touch-based input function that allows a user to easily input information or commands intuitively and conveniently, in addition to a display function for displaying images. In order to provide a touch-based input function, the touch display device should be able to detect the presence or absence of a user's touch and accurately sense touch coordinates in the display panel.

The touch display device can drive various display driving elements (eg, data lines, gate lines, pixel electrodes, common electrodes, etc.) to perform a display function, and can detect the touch of the display panel by sensing touch electrodes corresponding to the touch sensors.

In this touch display device, the display performance or the touch sensing performance can be deteriorated due to the influence between the display driving and the touch driving (driving of the touch electrode). In addition, since the touch display device includes complicated electrodes and electric line structure, various parasitic capacitances and noise can be generated resulting in the problem that touch sensing performance or display performance is deteriorated.

SUMMARY OF THE INVENTION

An aspect of embodiments of the present disclosure is to provide a touch display device, a touch circuit and a driving method capable of reducing or eliminating mutual interference effects between the display and the touch sensing, thereby improving the display performance and the touch sensing performance.

Another aspect of embodiments of the present disclosure is to provide a touch display device, a touch circuit and a driving method capable of improving the accuracy of touch sensing by allowing a high signal-to-noise ratio (SNR) to be secured even when noise flows into the touch electrode or the touch circuit.

Another aspect of embodiments of the present disclosure is to provide a touch display device, a touch circuit and a driving method capable of improving pen sensing accuracy by obtaining a high signal-to-noise ratio at the time of pen sensing even when noise flows into the touch electrode or the touch circuit.

Another aspect of embodiments of the present disclosure is to provide a touch display device, a touch circuit and a driving method capable of eliminating the influence of the noise voltage input by using the voltage control at the other input terminal of the touch circuit even if the noise voltage flows into one input terminal of the touch circuit through the common electrode of the light emitting element in each subpixel used for driving the display.

Another aspect of embodiments of the present disclosure is to provide a touch display device, a touch circuit and a driving method capable of eliminating the influence of noise voltage input by electrically connecting other input terminals of the touch circuit to the common electrode even if the noise voltage flows into one input terminal of the touch circuit through the common electrode of the light emitting element in each subpixel used for driving the display.

Another aspect of embodiments of the present disclosure is to provide a touch display device, a touch circuit and a driving method capable of minimizing the influence of noise by synchronizing the common voltage applied to the common electrode of the light-emitting elements in each subpixel used in the display driving with the reference voltage of the touch circuit.

In accordance with an aspect of the present disclosure, there can be provided with a touch display device including a display panel in which a plurality of data lines, a plurality of gate lines, a plurality of subpixels and a plurality of touch electrodes are disposed, and a touch circuit for sensing at least one of the plurality of touch electrodes.

The plurality of touch electrodes can include first touch electrodes and second touch electrodes arranged in a direction crossing each other. Each of the first touch electrodes can be one electrode or a plurality of touch electrodes (division touch electrodes) electrically connected. Each of the second touch electrodes can be one electrode or a plurality of touch electrodes (division touch electrodes) electrically connected.

Each of the plurality of subpixels can include a light emitting element including a pixel electrode, a light emitting layer and a common electrode, and a driving transistor for driving the light emitting element.

The touch circuit can include an operational amplifier having a first input terminal for inputting a reference voltage, a second input terminal to be connected to a sensing target touch electrode to be sensed, and an output terminal for outputting a output voltage.

The first input terminal of the operational amplifier can be electrically connected to the common electrode. Accordingly, the first input terminal of operational amplifier and the common electrode can have a corresponding voltage state.

The common voltage applied to the common electrode and the reference voltage input to the first input terminal of the operational amplifier can be synchronized with each other. That is, the common voltage applied to the common electrode and the reference voltage input to the first input terminal of the operational amplifier can be corresponding signal types, can have corresponding voltage levels, or can have corresponding signal characteristics (voltage characteristics).

The common voltage applied to the common electrode and the reference voltage input to the first input terminal of the operational amplifier can be modulation signals whose voltages are variable and can be synchronized by having a frequency and a phase corresponding to each other.

The common voltage applied to the common electrode and the reference voltage input to the first input terminal of the operational amplifier can be synchronized to a DC voltage.

The first input terminal of the operational amplifier can be directly connected to the common electrode, or can be electrically connected to the common electrode through the synchronization line.

The touch display device can include a common voltage source for supplying the common voltage to the common electrode and a reference voltage source for supplying the reference voltage to the first input terminal of the operational amplifier.

Alternatively, the touch display device can include a voltage source connected in common with the first input terminal of the operational amplifier and the common electrode.

In the case that the operation mode of the touch display device is the pen sensing mode, the touch circuit can detect the pen signal outputted from the pen through the sensing target touch electrode, and the reference voltage and the common voltage can be a modulation signal including a corresponding phase and a corresponding frequency.

In the case that the operation mode of the touch display device is the pen sensing mode, the driving voltage applied to the driving transistor can be a modulation signal having a frequency and a phase corresponding to the reference voltage and the common voltage. The pen signal can be in antiphase with the reference voltage and the common voltage, or can be in-phase with the reference voltage and the common voltage.

The plurality of touch electrodes can be classified into first touch electrodes to which a driving signal is applied and second touch electrodes to detect a sensing signal. In the case that the operation mode of the touch display device is the finger sensing mode, the touch circuit can apply a driving signal to at least one of the first touch electrodes among the plurality of the first touch electrodes, and can detect the sensing signal through the second input terminal of the operational amplifier electrically connected to the second touch electrode as the sensing target touch electrode among the plurality of the second touch electrodes.

In the case that the operation mode of the touch display device is a finger sensing mode based on a mutual capacitance, the reference voltage and the common voltage can be a DC voltage. The driving voltage applied to the driving transistor can be a DC voltage. The driving signal can be a modulation signal having a predetermined frequency.

In the case that the operation mode of the touch display device is the finger sensing mode based on a self-capacitance, the touch circuit can apply the driving signal to the sensing target touch electrode among the plurality of touch electrodes, and can detect the sensing signal through the second input terminal of the operational amplifier electrically connected to the sensing target touch electrode to which the driving signal is applied.

In the case that the operation mode of the touch display device is the finger sensing mode based on a self-capacitance, the reference voltage and the common voltage can be modulation signals having corresponding frequencies. In addition, the driving voltage applied to the driving transistor can be a modulation signal having a frequency corresponding to the reference voltage and the common voltage.

The display panel can further include an encapsulation layer disposed on the light emitting element. The plurality of data lines, the plurality of gate lines and the driving transistor can be located under the encapsulation layer. The plurality of touch electrodes can be located on the encapsulation layer.

The display panel can include one or more dams located in a non-active area which is an outer area of an active area in which an image is displayed, or located at a boundary between the active area and the non-active area.

The display panel can include a plurality of touch routing lines for electrically connecting the plurality of touch electrodes and the touch circuit, and a plurality of touch pads electrically connected to the plurality of touch routing lines and disposed in the non-active area. The plurality of touch routing lines can be electrically connected to the plurality of touch pads located in the non-active area with extending over the side of the encapsulation layer and the top of the at least one dam.

In accordance with another aspect of the present disclosure, there is provided with a method for driving a touch display device including detecting a sensing signal through the touch electrode to be sensed among a plurality of touch electrodes disposed on the display panel, and sensing the finger touch or pen touch based on the sensing signal.

Each of the plurality of subpixels disposed on the display panel can include a light emitting element including a pixel electrode, a light emitting layer and a common electrode, and a transistor for driving the light emitting element.

In the case that the sensing signal is input to the touch circuit from the sensing target touch electrode, the reference voltage is input to the touch circuit, and the reference voltage can be synchronized with the common voltage applied to the common electrode.

The common voltage applied to the common electrode and the reference voltage input to the first input terminal of the operational amplifier can be modulation signals whose voltages are variable and can be synchronized by having a frequency and a phase corresponding to each other.

Alternatively, the common voltage applied to the common electrode and the reference voltage input to the first input terminal of the operational amplifier can be synchronized to the DC voltage.

In accordance with another aspect of the present disclosure, there is provided with a touch circuit including an operational amplifier electrically connected to the sensing target touch electrode among the plurality of touch electrodes disposed on the display panel, an integrator electrically connected to the output terminal of the operational amplifier, and an analog-to-digital converter for converting the integrated value output from the integrator into a digital value.

The operational amplifier can include a first input terminal to which a reference voltage is input, a second input terminal to be connected to the sensing target touch electrode, and the output terminal to which an output voltage is output.

The reference voltage input to the first input terminal of the operational amplifier can be synchronized with a common voltage applied to the display panel.

The common voltage can be a voltage applied to the common electrode among the pixel electrode, the light emitting layer and the common electrode included in the light emitting element in each subpixel arranged in the display panel.

The first input terminal of the operational amplifier can be electrically connected to the common electrode.

According to embodiments of the present disclosure, it is possible to improve the display performance and touch sensing performance by reducing or eliminating mutual interference effects between display operation and touch sensing operation.

In accordance with another aspect of the present disclosure, there is provided with a touch display device including: a display panel including a plurality of data lines, a plurality of gate lines, a plurality of touch electrodes, and a plurality of touch routing lines which are disposed on a substrate, wherein the display panel further includes an active area configured to display an image, and a non-active area which is outer to the active area; and a touch circuit configured to sense at least one of the plurality of touch electrodes, wherein the display panel further includes: a plurality of subpixels including a light emitting element including a pixel electrode, a light emitting layer, a common electrode, and a driving transistor to drive the light emitting element; and an encapsulation layer disposed on the common electrode, wherein the plurality of touch electrodes are disposed on the encapsulation layer, and the plurality of touch routing lines are disposed along an inclined surface of the encapsulation layer, and electrically connected to a plurality of touch pads disposed in the non-active area along an inclined surface of the encapsulation layer, wherein the touch circuit includes an operational amplifier having a first input terminal for inputting a reference voltage, a second input terminal connected to a sensing target touch electrode, and an output terminal for outputting an output voltage, and wherein a common voltage applied to the common electrode and the reference voltage inputted to the first input terminal of the operational amplifier are synchronized with each other.

According to embodiments of the present disclosure, it is possible to secure the high signal-to-noise ratio thereby improving the accuracy of the touch sensing even if noise is introduced into the touch electrode or the touch circuit.

According to embodiments of the present disclosure, it is possible to secure the high signal-to-noise ratio thereby improving the accuracy of the pen sensing even if noise is introduced into the touch electrode or the touch circuit.

According to embodiments of the present disclosure, even if the noise voltage is introduced into one input terminal of the touch circuit through the common electrode of the light emitting element in each subpixel used in the display driving, it is possible to improve the touch sensing performance by eliminating or reducing the influence of noise voltage input through the control for the voltage at the other input terminal of the touch circuit.

According to embodiments of the present disclosure, even if the noise voltage is introduced into one input terminal of the touch circuit through the common electrode of the light emitting element in each subpixel used in the display driving, it is possible to improve the touch sensing performance by eliminating or reducing the influence of noise voltage input by electrically connecting the other input terminal of the touch circuit to the common electrode.

According to embodiments of the present disclosure, it is possible to improve the touch sensing performance by eliminating or reducing the influence of noise voltage input by synchronizing the common voltage applied to the common electrode of the light emitting element in each subpixel used in the display driving with the reference voltage of the touch circuit.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE EMBODIMENTS

Figure 1:
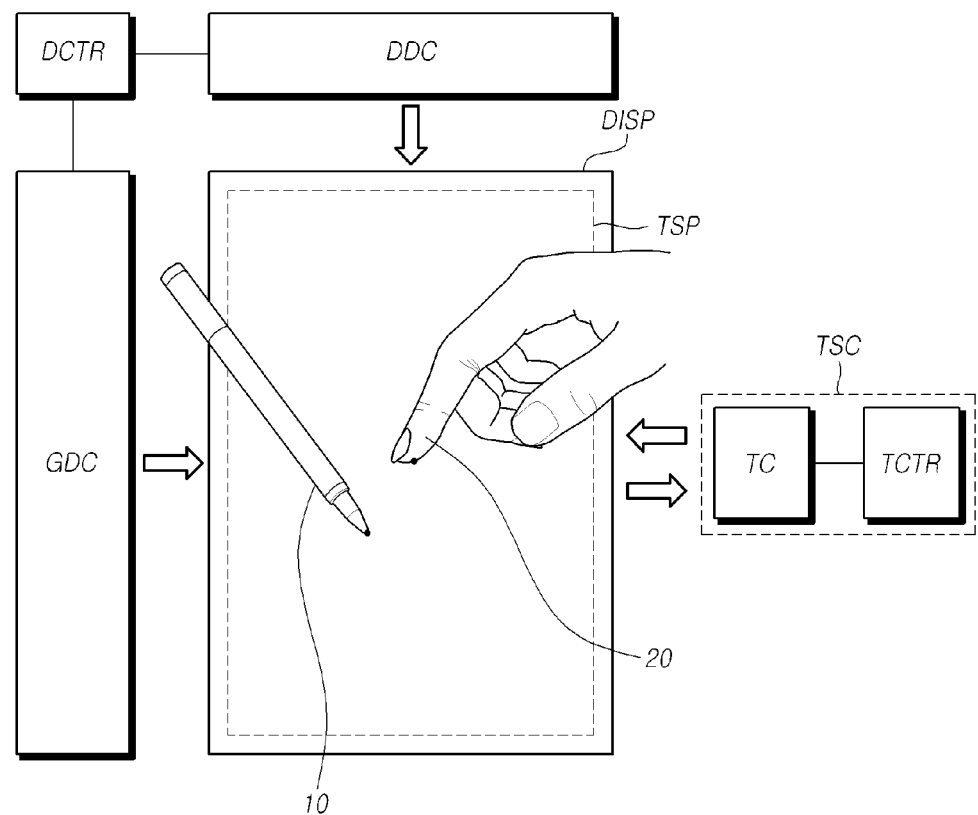
FIG. 1 is a diagram illustrating system configuration of the touch display device according to embodiments of the present invention.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it can make the subject matter of the present disclosure rather unclear.

In addition, terms, such as first, second, A, B, (a), (b) or the like can be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element can "be connected to", "be coupled to", or "be in contact with" the structural elements as well as that the certain structural element is directly connected to or is in direct contact with another structural element.

FIG. 1 is a diagram illustrating system configuration of the touch display device according to embodiments of the present invention.

Referring to FIG. 1, the touch display device according to embodiments of the present invention can provide both the function for displaying an image and the function for touch sensing.

In order to provide the image display function, the touch display device according to embodiments of the present invention can include a display panel (DISP) in which a plurality of data lines and a plurality of gate lines, a plurality of subpixel defined by the plurality of data lines and the plurality of gate lines are arranged, a data driving circuit (DDC) for driving the plurality of data lines, a gate driving circuit (GDC) for driving the plurality of gate lines, and a display controller (DCTR) for controlling the operation of the data driving circuit (DDC) and the gate driving circuit (GDC).

Each of the data driving circuit (DDC), the gate driving circuit (GDC) and the display controller (DCTR) can be implemented as one or more separate components. In some cases, two or more of the data driving circuit (DDC), the gate driving circuit (GDC) and the display controller (DCTR) can be integrated into one component. For example, the data driver circuit (DDC) and the display controller (DCTR) can be implemented as a single integrated circuit chip (IC Chip).

In order to provide the touch sensing function, the touch display device according to embodiments of the present invention can include a touch panel (TSP) including a plurality of touch electrodes, and a touch sensing circuit (TSC) for applying the driving signal to the touch panel (TSP), detecting a sensing signal from the touch panel (TSP), and sensing the presence or absence of a user's touch or touch position (touch coordinates) on the touch panel (TSP) based on the detected sensing signal.

The touch sensing circuit (TSC) can include a touch circuit (TC) for supplying the driving signal to the touch panel (TSP) and detecting the sensing signal from the touch panel (TSP), and a touch controller (TCTR) for sensing the presence of a user's touch and/or touch position on the touch panel (TSP) based on the detected sensing signal.

The touch circuit (TC) can include a first circuit part for supplying the driving signal to the touch panel (TSP) and a second circuit part for detecting a sensing signal from the touch panel (TSP).

The touch circuit (TC) and the touch controller (TCTR) can be implemented as separate components or can be integrated into single component.

Each of the data driving circuit (DDC), the gate driving circuit (GDC) and the touch circuit (TC) can be implemented as one or more integrated circuits. In view of electrical connection with the display panel (DISP), each of the data driving circuit (DDC), the gate driving circuit (GDC) and the touch circuit (TC) can be implemented by a COG (Chip On Glass) type, a COF (Chip On Film) type, a TCP (Tape Carrier Package) type or the like, and the gate driving circuit (GDC) can be implemented by a GIP (Gate In Panel) type.

In addition, each of the circuit configurations (DDC, GDC, and DCTR) for driving the display operation and the circuit constructions (TC and TCTR) for touch sensing can be implemented as one or more individual components. In some cases, at least one of the circuit configurations (DDC, GDC, and DCTR) for driving the display operation and the circuit configurations (TC, TCTR) for touch sensing can be functionally integrated into one or more components. For example, the data driving circuit (DDC) and the touch circuit (TC) can be integrated into one or more integrated circuit chips. In the case that the data driving circuit (DDC) and the touch circuit (TC) are integrated into two or more integrated circuit chips, each of the two or more integrated circuit chips can have a data driving function and a touch driving function.

The touch display device according to embodiments of the present invention can be various types such as an organic light emitting display (OLED) device, a liquid crystal display (LCD) device, and the like. Hereinafter, for convenience of explanation, the touch display device will be described as the organic light emitting display (OLED) device as an example. That is, the display panel (DISP) can be of various types such as an organic light emitting display (OLED) panel, a liquid crystal display (LED) panel, and the like. Hereinafter, the display panel (DISP) will be described as the organic light emitting display panel for convenience of explanation as an example.

As will be described later, the touch panel (TSP) can include a plurality of touch electrodes for applying the driving signals or detecting the sensing signals, and a plurality of touch routing lines for connecting the plurality of touch electrodes to the touch circuits (TC).

The touch panel (TSP) can be disposed outside the display panel (DISP). That is, the touch panel (TSP) and the display panel (DISP) can be separately manufactured and combined. Such a touch panel (TSP) can be referred to as an external type or an add-on type.

Alternatively, the touch panel (TSP) can be embedded inside the display panel (DISP). That is, when manufacturing the display panel (DISP), the touch sensor structure such as the plurality of touch electrodes and the plurality of touch routing lines constituting the touch panel (TSP) can be formed together with electrodes and signal lines for driving the display operation. Such a touch panel (TSP) can be referred to a built-in type. Hereinafter, for convenience of explanation, a case in which the touch panel (TSP) is of the built-in type will be described as an example.

Figure 2:
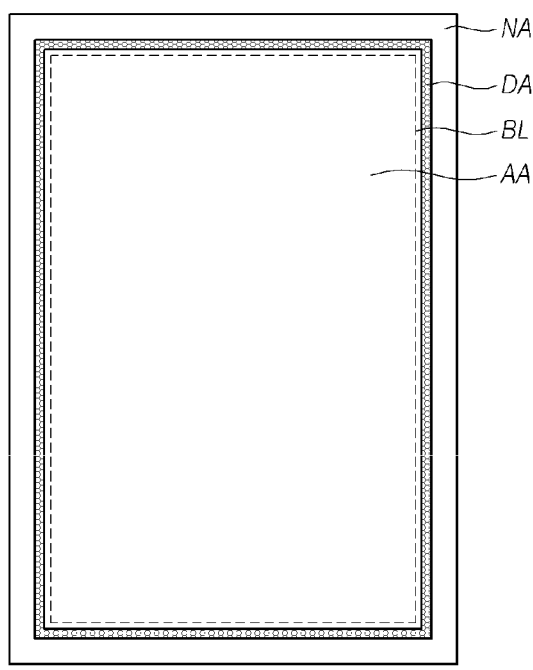
FIG. 2 is a schematic diagram of the display panel of the touch display device according to embodiments of the present invention.

FIG. 2 is a schematic diagram of the display panel of the touch display device according to embodiments of the present invention.

Referring to FIG. 2, the display panel (DISP) can include an active area (AA) in which an image is displayed and a non-active area (NA) which is an outer area of an outer boundary line (BL) of the active area (AA).

In the active area (AA) of the display panel (DISP), the plurality of subpixels for displaying the image are arranged, and various electrodes and signal lines for driving the display operation are arranged.

In the active area (AA) of the display panel (DISP), the plurality of touch electrodes for touch sensing and the plurality of touch routing lines electrically connected to the touch electrodes can be arranged. Accordingly, the active area (AA) can be referred to as a touch sensing area capable of touch sensing.

In the non-active area (NA) of the display panel (DISP), a plurality of link lines extending from various signal lines arranged in the active area (AA) or a plurality of link lines electrically connected with various signal lines arranged in the active area (AA), and pads electrically connected to the link lines can be disposed. Pads arranged in the non-active area (NA) can be bonded or electrically connected to the display driving circuit (DDC, GDC, etc.).

In addition, in the non-active area (NA) of the display panel (DISP), a plurality of link lines extending from the plurality of touch routing lines arranged in the active area (AA) or a plurality of link lines electrically connected with the plurality of touch routing lines arranged in the active area (AA), and pads electrically connected to the link lines can be disposed. Pads arranged in the non-active area (NA) can be bonded or electrically connected to the touch circuit (TC).

In the non-active area (NA), there can be provided with a portion where the outermost touch electrode among the plurality of touch electrodes disposed in the active area AA is extended. In addition, at least one electrode (touch electrode) of the same material as the touch electrode disposed in the active area (AA) can be further disposed in the non-active area (NA). That is, the plurality of touch electrodes disposed on the display panel (DISP) are all disposed in the active area AA, or some touch electrodes (e.g., the outermost touch electrodes) among the plurality of touch electrodes disposed on the display panel (DISP) can be disposed in the non-active area (NA) or can be disposed over the active area (AA) and the non-active area (NA).

Referring to FIG. 2, the display panel (DISP) of the touch display device according to the embodiments of the present invention can include a dam area (DA) in which a dam for preventing any layer (for example, an encapsulation layer in the organic light emitting display panel) in the active area (AA) from collapsing is disposed.

The dam area (DA) can be located at a boundary point between the active area (AA) and the non-active area (NA) or at any point of the non-active area (NA) which is an outer region of the active area (AA).

The dam disposed in the dam area (DA) can be arranged to surround all directions of the active area (AA) or can be disposed only on the outer periphery of one or two or more portions (for example, a portion having a fragile layer) of the active area (AA).

The dam disposed in the dam area (DA) can be a pattern to be connected all together, or can be formed of two or more patterns that are disconnected. Furthermore, in the dam area (DA), only a first dam, or two dams (first dam, second dam), or three or more dams can be disposed.

In the dam area (DA), there can be only the first dam in any one direction and the first dam and the second dam in any other direction.

Figure 3:
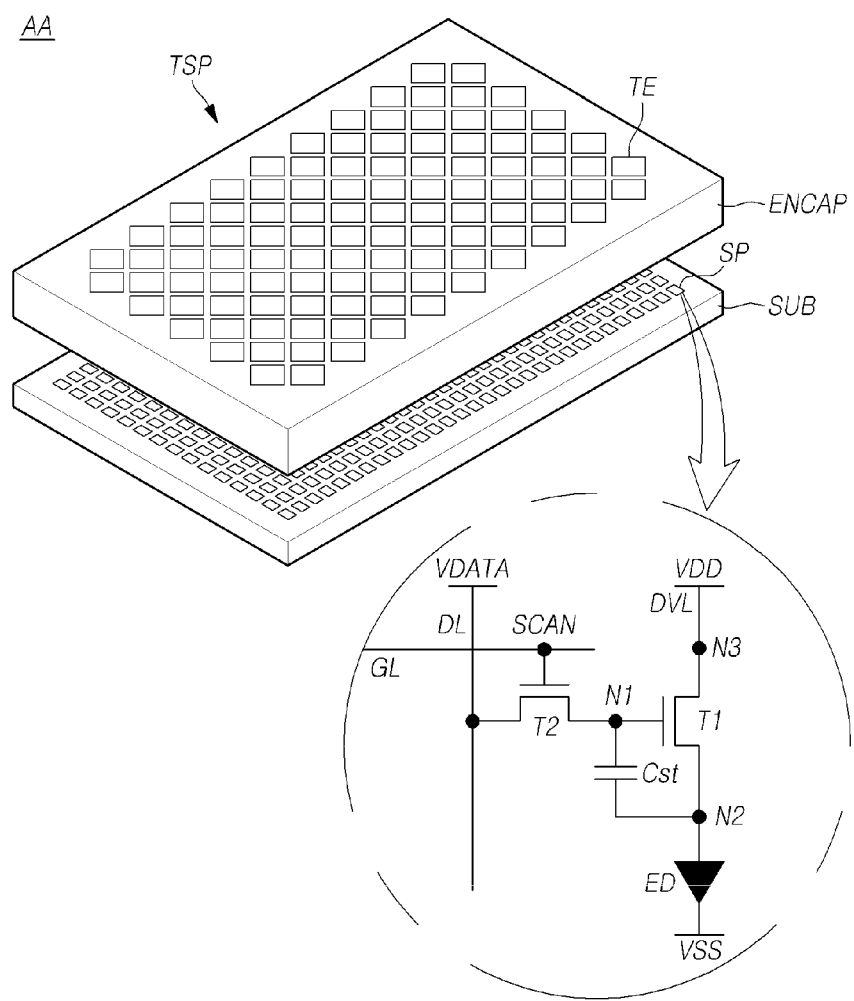
FIG. 3 is a diagram illustrating the structure in which the touch panel is embedded in the display panel according to embodiments of the present invention.

FIG. 3 is a diagram illustratively showing the structure in which the touch panel is embedded in the display panel according to embodiments of the present invention.

Referring to FIG. 3, in the active area (AA) of the display panel (DISP), the plurality of subpixels (SP) are arranged on the substrate (SUB).

Each subpixel (SP) can include the light emitting element (ED), a first transistor (T1) for driving the light emitting element (ED), a second transistor (T2) for transferring a data voltage (VDATA) to a first node (N1) of the first transistor T1, and a storage capacitor (Cst) for maintaining a constant voltage for one frame.

The first transistor (T1) can include the first node (N1) to which the data voltage is applied, a second node (N2) to be electrically connected to the light emitting element (ED), and a third node (N3) to which the driving voltage (VDD) from a driving voltage line (DVL) is applied. The first node (N1) can be a gate node, the second node (N2) can be a source node or a drain node, and the third node (N3) can be a drain node or a source node. The first transistor (T1) can be also referred to as a driving transistor for driving the light emitting element (ED).

The light emitting element (ED) can include a first electrode (eg, an anode electrode), a light emitting layer and a second electrode (eg, a cathode electrode). The first electrode can be electrically connected to the second node (N2) of the first transistor (T1) and a base voltage (VSS) can be applied to the second electrode.

Hereinafter, the first electrode of the light emitting element (ED) is also referred to as the pixel electrode (an electrode existing in each subpixel separately), and the second electrode of the light emitting element (ED) is also referred to as a common electrode. The common electrode can be an electrode common to all the subpixel, and can be a single plate electrode or an electrode divided into a plurality of electrodes. The base voltage (VSS) applied to the common electrode is also referred to as a common voltage.

The light emitting layer in the light emitting element (ED) can be an organic light emitting layer containing an organic material. In this case, the light emitting element (ED) can be an organic light emitting diode (OLED).

The second transistor (T2) can be turned on and off by a scan signal (SCAN) applied through the gate line (GL) and can be electrically connected between the first node (N1) of the first transistor (T1) and the data line (DL). The second transistor T2 can be also referred to as a switching transistor.

The second transistor T2 is turned on by the scan signal (SCAN) and transfers the data voltage (VDATA) supplied from the data line (DL) to the first node (N1) of the first transistor (T1).

The storage capacitor (Cst) can be electrically connected between the first node (N1) and the second node (N2) of the first transistor (T1).

Each subpixel (SP) can have a 2T1C structure including two transistors (T1, T2) and one capacitor (Cst) as shown in FIG. 3, and in some cases, can further include one or more transistors or one or more capacitors.

The storage capacitor (Cst) need not be a parasitic capacitor (eg, Cgs, Cgd) which is an internal capacitor existing between the first node (N1) and the second node (N2) of the first transistor (T1) but can be an external capacitor intentionally designed outside the first transistor (T1).

Each of the first transistor (T1) and the second transistor (T2) can be an n-type transistor or a p-type transistor.

As described above, the circuit elements such as the light emitting element (ED), two or more transistors (T1, T2) and one or more capacitors (Cst) can be arranged in the display panel (DISP). Such a circuit element (in particular, the light emitting element ED) can be vulnerable to external moisture or oxygen, and therefore, an encapsulation layer (ENCAP) for preventing external moisture or oxygen from introducing into the circuit element (in particular, the light emitting element ED) can be disposed on the display panel (DISP).

The encapsulation layer (ENCAP) can be a single layer or can be a plurality of layers.

For example, in the case that the encapsulation layer (ENCAP) comprises a plurality of layers, the encapsulation layer (ENCAP) can include one or more inorganic encapsulation layers and one or more organic encapsulation layers. As a specific example, the encapsulation layer (ENCAP) can comprise a first inorganic encapsulation layer, an organic encapsulation layer and a second inorganic encapsulation layer. Here, the organic encapsulation layer can be located between the first inorganic encapsulation layer and the second inorganic encapsulation layer.

The first inorganic encapsulation layer can be formed on the second electrode (eg, the cathode electrode) so as to be closest to the light emitting element (ED). The first inorganic encapsulation layer can be formed of an inorganic insulating material capable of low temperature deposition such as silicon nitride (SiNx), silicon oxide (SiOx), silicon oxynitride (SiON), or aluminum oxide (Al2O3). Accordingly, since the first inorganic encapsulation layer is deposited in a low-temperature atmosphere, damage to the light emitting layer (organic light emitting layer) vulnerable to a high-temperature can be prevented during the deposition of the first inorganic encapsulation layer.

The organic encapsulation layer can have a smaller area than the first inorganic encapsulation layer and can be formed to expose both ends of the first inorganic encapsulation layer. The organic encapsulation layer can function as a buffer for relieving the stress between the respective layers due to the bending of the touch display device, and can enhance the planarization performance. The organic encapsulation layer can be formed of, for example, an organic insulating material such as acrylic resin, epoxy resin, polyimide, polyethylene or silicon oxycarbide (SiOC).

The second inorganic encapsulation layer can be formed on the organic encapsulation layer so as to cover the upper surface and the side surfaces of the organic encapsulation layer and the first inorganic encapsulation layer, respectively. Accordingly, the second inorganic encapsulation layer can minimize or prevent external moisture or oxygen from penetrating into the first inorganic encapsulation layer and the organic encapsulation layer. The second inorganic encapsulation layer can be formed of, for example, an inorganic insulating material such as silicon nitride (SiNx), silicon oxide (SiOx), silicon oxynitride (SiON), or aluminum oxide (Al2O3).

In the touch display device according to the embodiments of the present invention, the touch panel (TSP) can be formed on the encapsulation layer (ENCAP).

That is, in the touch display device, the touch sensor structure such as the plurality of touch electrodes (TE) forming the touch panel (TSP) can be disposed on the encapsulation layer (ENCAP).

In the touch sensing, the driving signal or the sensing signal can be applied to the touch electrode (TE). Therefore, in the touch sensing, a potential difference can be formed between the touch electrode (TE) and the cathode electrode disposed with the encapsulation layer (ENCAP) therebetween, and unnecessary parasitic capacitance can be generated. Since this parasitic capacitance can lower the touch sensitivity, the distance between the touch electrode (TE) and the cathode electrode can be set to a predetermined value (for example, 5 μm) or more. For this, for example, the thickness of the encapsulation layer (ENCAP) can be designed to be at least 5 μm or more.

Figure 4:
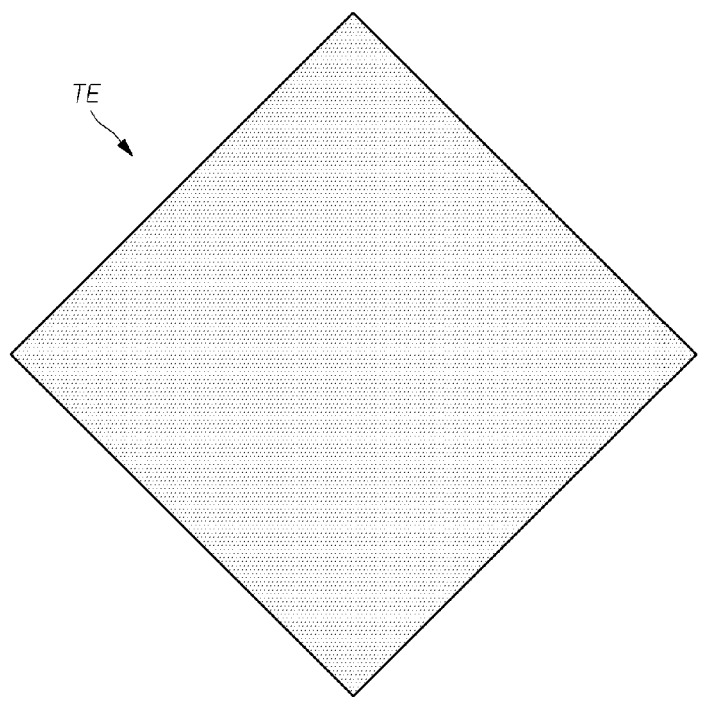
FIGS. 4 and 5 are views illustrating example types of touch electrodes disposed on the display panel according to embodiments of the present invention.
Figure 5:
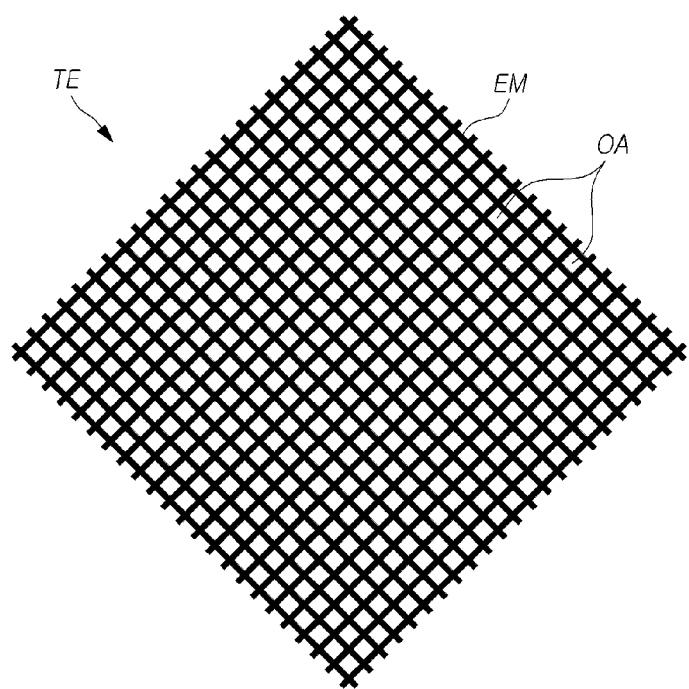

FIGS. 4 and 5 are views illustrating example types of touch electrodes disposed on the display panel according to embodiments of the present invention.

Referring to FIG. 4, each of the touch electrodes (TE) disposed on the display panel (DISP) can be a plate shaped electrode metal having no openings. In this case, each touch electrode (TE) can be a transparent electrode. That is, each touch electrode (TE) can be formed of the transparent electrode material so that light emitted from the plurality of subpixels (SP) arranged below can be transmitted upward.

Alternatively, as shown in FIG. 5, each of the touch electrodes (TE) disposed on the display panel (DISP) can be patterned into a mesh type to form electrode metal (EM) having two or more openings (OA).

The electrode metal (EM) corresponds to a substantial touch electrode (TE) and is a portion where the driving signal is applied or the sensing signal is detected.

Referring to FIG. 5, in the case that each touch electrode (TE) is the electrode metal (EM) patterned with a mesh type, two or more openings (OA) can exist in a region of the touch electrode (TE).

Each of the at least two openings (OA) in each touch electrode (TE) can correspond to a light emitting region of one or more subpixels (SP). That is, the plurality of openings (OA) can be paths through which the light emitted from the plurality of subpixels (SP) arranged below passes. For example, each of the plurality of touch electrodes (TE) is a mesh type including an open area (or opening (OA)), and the open area positionally corresponds to a light emitting region of the subpixels (SP). Hereinafter, for convenience of explanation, it is assumed that each touch electrode (TE) is the mesh-type electrode metal (EM).

The electrode metal (EM) corresponding to each touch electrode (TE) can be located on a bank which is disposed in an area other than the light emitting area of two or more sub pixels (SP).

Meanwhile, as a method of forming the plurality of touch electrodes (TE), after the electrode metal (EM) is formed in a wide mesh shape, the electrode metal (EM) can be cut into a predetermined pattern to electrically separate the electrode metal (EM) to thereby form the plurality of touch electrodes (TE).

As shown in FIGS. 4 and 5, the outline shape of the touch electrode (TE) can be a square shape such as a diamond shape, a rhombus shape, or another shapes such as a triangle shape, a pentagon shape or a hexagon shape.

Figure 6:
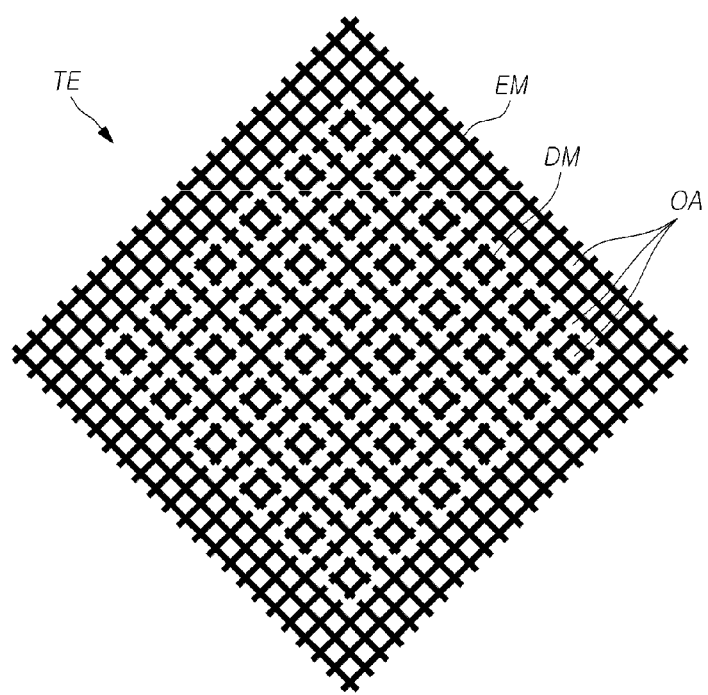
FIG. 6 is a view illustrating an example mesh-type touch electrode of FIG. 5.

FIG. 6 is a view illustrating an example mesh-type touch electrode of FIG. 5.

Referring to FIG. 6, in the area of each touch electrode (TE), there can be the mesh type electrode metal (EM) and at least one dummy metal (DM) separated from the mesh type electrode metal (EM).

The electrode metal (EM) is a portion corresponding to a substantial touch electrode (TE) and is the portion in which the driving signal (the driving signal for finger sensing or pen sensing) is applied or the sensing signal (the sensing signal for finger sensing or pen sensing) is detected. Meanwhile, though the dummy metal (DM) can exist in the area of the touch electrode (TE), the driving signal is not applied to the dummy metal (DM) and the sensing signal is not detected at the dummy metal (DM). That is, the dummy metal (DM) can be an electrically floated metal portion.

Accordingly, the electrode metal (EM) can be electrically connected to the touch circuit (TC), but the dummy metal (DM) is not electrically connected to the touch circuit (TC).

At least one dummy metal (DM) can exist in a state of being disconnected from the electrode metal (EM) in a region of each of the touch electrodes (TE).

Alternatively, at least one dummy metal (DM) can exist in the state of being disconnected from the electrode metal (EM) only in a region of each of some touch electrode among all the touch electrodes (TE). That is, the dummy metal (DM) need not exist in the area of some of the touch electrodes (TE).

As shown in FIG. 5, with regard to the role of dummy metal (DM), in the case that there is no dummy metal DM in the area of the touch electrode (TE) and only the electrode metal (EM) is formed as the mesh type, a visibility problem in which the contour of the electrode metal (EM) is visible on the display surface can occur.

In contrast, as shown in FOG. 6, in the case that one or more dummy metals (DM) are present in the area of the touch electrode (TE), the visibility problem of the outline of the electrode metal (EM) on the display surface can be prevented.

Furthermore, the capacitance of each touch electrode (TE) can be adjusted to improve the touch sensitivity by adjusting the presence or number (dummy metal ratio) of the dummy metal (DM) for each touch electrode (TE).

Meanwhile, the cut electrode metal (EM) can be formed of the dummy metal (DM) by cutting some points on the electrode metal (EM) formed in the area of one touch electrode (TE). That is, the electrode metal (EM) and the dummy metal (DM) can be the same material formed in the same layer.

The touch display device according to the embodiments of the present invention can sense a touch based on the capacitance formed on the touch electrode (TE).

The touch display device according to embodiments of the present invention can utilize the capacitance-based touch sensing method, which can sense a touch by a mutual-capacitance-based touch sensing method or a self-capacitance-based touch sensing method.

In the case of a mutual-capacitance-based touch sensing method, a plurality of touch electrodes (TE) can be classified into the driving touch electrode (transmission touch electrode) for applying the driving signal, and the sensing touch electrode (receiving touch electrode) which is used for detecting the sensing signal and forms capacitance with the driving touch electrode.

In the case of the mutual-capacitance-based touch sensing method, the touch sensing circuit (TSC) can detects presence/absence of touch and/or touch coordinates based on a change in capacitance (mutual-capacitance) between the driving touch electrode and the sensing touch electrode generated in accordance with the presence or absence of a pointer such as the finger 20, pen 10 and the like.

In the case of a self-capacitance-based touch sensing method, each touch electrode (TE) can serve as both the driving touch electrode and the sensing touch electrode. That is, the touch sensing circuit (TSC) applies the driving signal to one or more touch electrodes (TE) and detects the sensing signal through the touch electrode (TE) to which the driving signal is applied. And then, the touch sensing circuit (TSC) can detect the presence or absence of a touch and/or the touch coordinates by using the change in capacitance between the touch electrode (TE) and the pointer such as the finger 20 and the pen 10 and based on the sensed sensing signal. In the self-capacitance-based touch sensing method, there is no distinction between the driving touch electrode and the sensing touch electrode.

As described above, the touch display device according to the embodiments of the present invention can sense the touch by the mutual-capacitance-based touch sensing method or the self-capacitance based touch sensing method. Hereinafter, for convenience of explanation, there is described as an example, the touch display device performing the mutual-capacitance-based touch sensing and having the touch sensor structure for this purpose.

Figure 7:
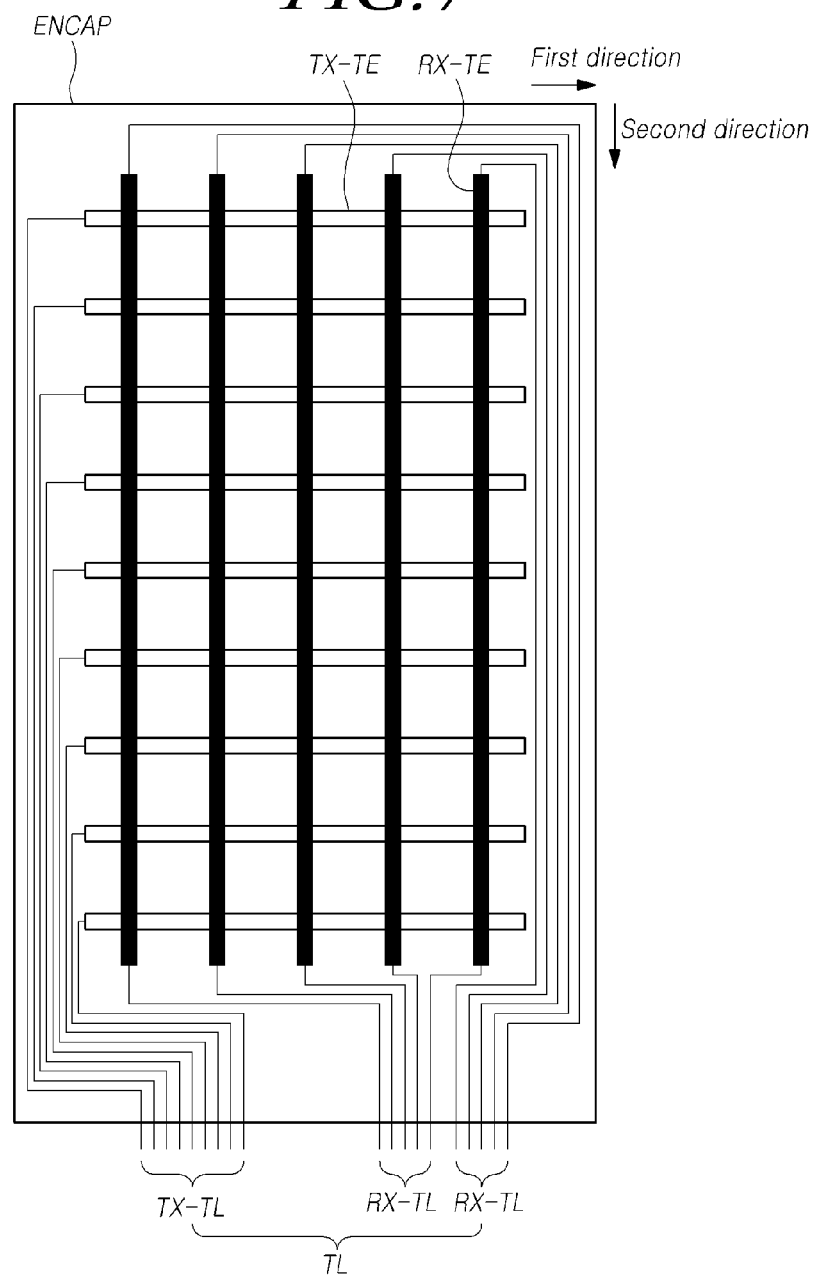
FIG. 7 is an example view of the touch sensor structure in the display panel according to embodiments of the present invention.

FIG. 7 is an example view of the touch sensor structure in the display panel according to embodiments of the present invention.

Referring to FIG. 7, the touch sensor structure for the mutual-capacitance-based touch sensing method can include a plurality of first touch electrodes (TX-TE) and a plurality of second touch electrodes (RX-TE). Here, the plurality of first touch electrodes (TX-TE) and the plurality of second touch electrodes (RX-TE) can be located on the encapsulation layer (ENCAP).

Each of the plurality of first touch electrodes (TX-TE) can be arranged in a first direction and each of the plurality of second touch electrodes (RX-TE) can be arranged in a second direction different from the first direction.

In the present specification, the first direction and the second direction can be relatively different from each other. For example, the first direction can be an x-axis direction (horizontal direction) and the second direction can be a y-axis direction (vertical direction). Conversely, the first direction can be the y-axis direction and the second direction can be the x-axis direction. Furthermore, the first direction and the second direction can be orthogonal to each other, but need not be orthogonal. Also, in this specification, rows and columns are relative, and rows and columns can be changed from a viewpoint of viewer.

Each of the plurality of first touch electrodes (TX-TE) can be a bar-shaped electrode. Each of the plurality of second touch electrodes (RX-TE) can also be one bar-shaped electrode.

For example, the plurality of first touch electrodes (TX-TE) can be the driving touch electrode to which the driving signal is applied, and the plurality of second touch electrodes (RX-TE) can be the sensing touch electrode for detecting the sensing signal (signal sensing).

In contrast, the plurality of first touch electrodes (TX-TE) can be the sensing touch electrode for detecting the sensing signal and the plurality of second touch electrodes (RX-TE) can be the driving touch electrode for applying the driving signal.

Alternatively, in some cases, the plurality of first touch electrodes (TX-TE) can be a touch electrode to which a driving signal is applied and a signal is detected, and the plurality of second touch electrodes (RX-TE) can also be a touch electrode to which a driving signal is applied and a signal is detected.

The touch sensor metal for touch sensing can further include a plurality of touch routing lines (TL) for electrical connection between the touch circuit (TC) and the plurality of touch electrodes (TX-TE, RX-TE) in addition to the plurality of first touch electrodes (TX-TE) and the plurality of second touch electrodes (RX-TE).

The plurality of touch routing lines (TL) can include at least one first touch routing line (TX-TL) connected to each of the plurality of first touch electrodes (TX-TE) and at least one second touch routing line (RX-TL) connected to each of the plurality of second touch electrodes (RX-TE).

Figure 8:
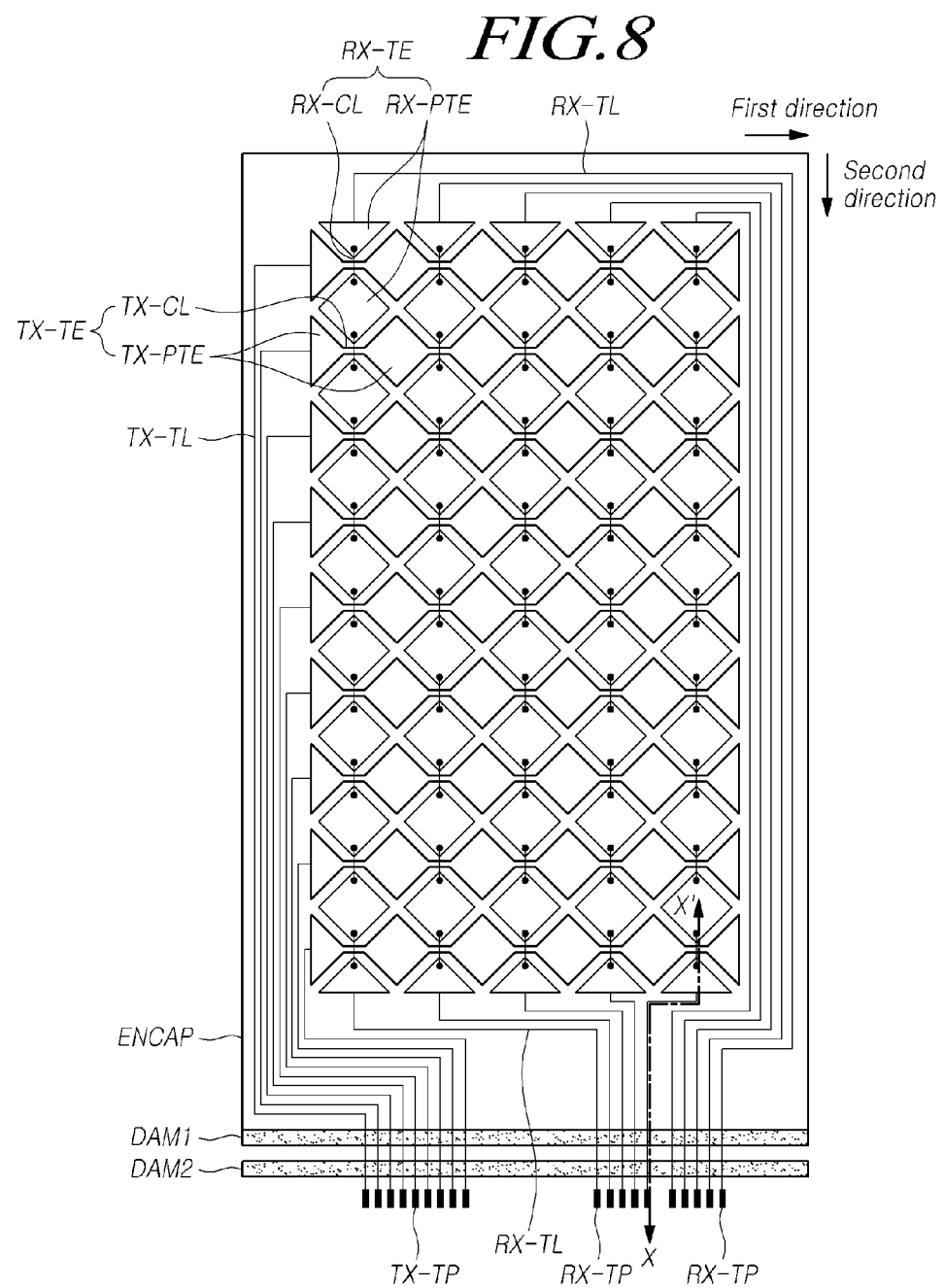
FIG. 8 is another example view of the touch sensor structure in the display panel according to embodiments of the present invention.

FIG. 8 is another example view of the touch sensor structure in the display panel according to embodiments of the present invention.

Referring to FIG. 8, each of the plurality of first touch electrodes (TX-TE) can include a plurality of first division touch electrodes (TX-PTE) arranged in the same row (or column) and one or more first connection line (TX-CL) for electrically connecting the plurality of first division touch electrodes (TX-PTE). Here, the first connection line (TX-CL) for connecting the two adjacent first division touch electrodes (TX-PTE) can be a metal pattern integrated with the adjacent two first division touch electrodes (TX-PTE) as shown FIG. 8 or can be a metal pattern connected to two adjacent first division touch electrodes (TX-PTE) through contact holes.

Each of the plurality of second touch electrodes (RX-TE) can include a plurality of second division touch electrodes (RX-PTE) arranged in the same row (or column) and one or more second connection line (RX-CL) for electrically connecting the plurality of second division touch electrodes (RX-PTE). Here, the second connection line (RX-CL) for connecting the two adjacent second division touch electrodes (RX-PTE) can be a metal pattern integrated with the adjacent two second division touch electrodes (RX-PTE) or can be a metal pattern connected to two adjacent second division touch electrodes (TX-PTE) through contact holes as shown in FIG. 8.

In the region where the first touch electrode (TX-TE) and the second touch electrode (RX-TE) intersect (the touch electrode line intersection region), the first connection line (TX-CL) and the second connection line (RX-CL) can be arranged to intersect with each other.

In this case, in the region where the first touch electrode (TX-TE) and the second touch electrode (RX-TE) intersect (touch electrode line intersection region), the first connection line (TX-CL) and the second connection line (RX-CL) can be crossed.

In the case that the first connection line (TX-CL) and the second connection line (RX-CL) intersect with each other in the touch electrode line intersection region, the first connection line (TX-CL) and the second connection line (RX-CL) should be arranged on different layers.

In order to arrange the plurality of first touch electrodes (TX-TE) and the plurality of second touch electrodes (RX-TE) so as to intersect with each other, the plurality of first division touch electrodes (TX-PTE), the plurality of second division touch electrodes (RX-PTE), the plurality of first connection lines (TX-CL) and the plurality of second connection lines (RX-CL) can be located in two or more layers.

In addition, a plurality of touch pads (TX-TP, RX-TP) electrically connected to the plurality of touch routing lines (TX-TL, RX-TL) can be arranged in the non-active area (NA) of the display panel (DISP).

Referring to FIG. 8, each of the plurality of first touch electrodes (TX-TE) can be electrically connected to the corresponding first touch pad (TX-TP) through at least one first touch routing line (TX-TL). That is, the first division touch electrode (TX-PTE) disposed at the outermost among the plurality of first division touch electrodes (TX-PTE) included in one first touch electrode (TX-TE) is electrically connected to corresponding first touch pad (TX-TP) through the first touch routing line (TX-TL).

Each of the plurality of second touch electrodes (RX-TE) can be electrically connected to the corresponding second touch pad (RX-TP) through at least one second touch routing line (RX-TL). That is, the second division touch electrode (RX-PTE) disposed at the outermost among the plurality of second division touch electrodes (RX-PTE) included in one second touch electrode (RX-TE) is electrically connected to corresponding second touch pad (RX-TP) through the second touch routing line (RX-TL).

In addition, as shown in FIG. 8, the plurality of first touch electrodes (TX-TE) and the plurality of second touch electrodes (RX-TE) can be disposed on the encapsulation layer (ENCAP). That is, the plurality of first division touch electrodes (TX-PTE) and the plurality of first connection lines (TX-CL) constituting the plurality of first touch electrodes (TX-TE) can be arranged on the encapsulation layer (ENCAP). The plurality of second division touch electrodes (RX-PTE) and the plurality of second connection lines (RX-CL) constituting the plurality of second touch electrodes (RX-TE) can be arranged on the encapsulation layer (ENCAP).

In addition, as shown in FIG. 8, each of the plurality of first touch routing lines (TX-TL) electrically connected to the plurality of first touch electrodes (TX-TE) is disposed on the encapsulation layer (ENCAP) and can extend to a region where the encapsulation layer (ENCAP) is not formed, and can be electrically connected to the first touch pad (TX-TP). Each of the plurality of second touch routing line (RX-TL) electrically connected to the plurality of second touch electrodes (RX-TE) is disposed on the encapsulation layer (ENCAP) and can extend to a region where the encapsulation layer (ENCAP) is not formed, and can be electrically connected to the second touch pad (RX-TP). Here, the encapsulation layer (ENCAP) can be located in the active area (AA) and, in some cases, can extend to the non-active area (NA).

As described above, in order to prevent collapse of any layer (e.g., an encapsulation layer in the organic light emitting display panel) in the active area (AA), the dam area (DA) can be disposed in the boundary area between the active area (AA) and the non-active area (NA) or in the non-active area (NA) which is an outer region of the active area (AA).

In the example of FIG. 8, a first dam (DAM1) and a second dam DAM2 can be disposed in the dam area (DA). Here, The second dam (DAM2) can be located further outward than the first dam (DAM1).

Alternatively, only the first dam (DAM1) can be located in the dam area (DA), and in some cases, one or more additional dams can be arranged in the dam area (DA) in addition to the first dam (DAM1) and the second dam (DAM2).

Referring to FIG. 8, the encapsulation layer (ENCAP) can be located on the side of the first dam (DAM1), or the encapsulation layer (ENCAP) can be located on the top portion of the first dam (DAM1) in addition to the side portion of the first dam (DAM1).

Figure 9:
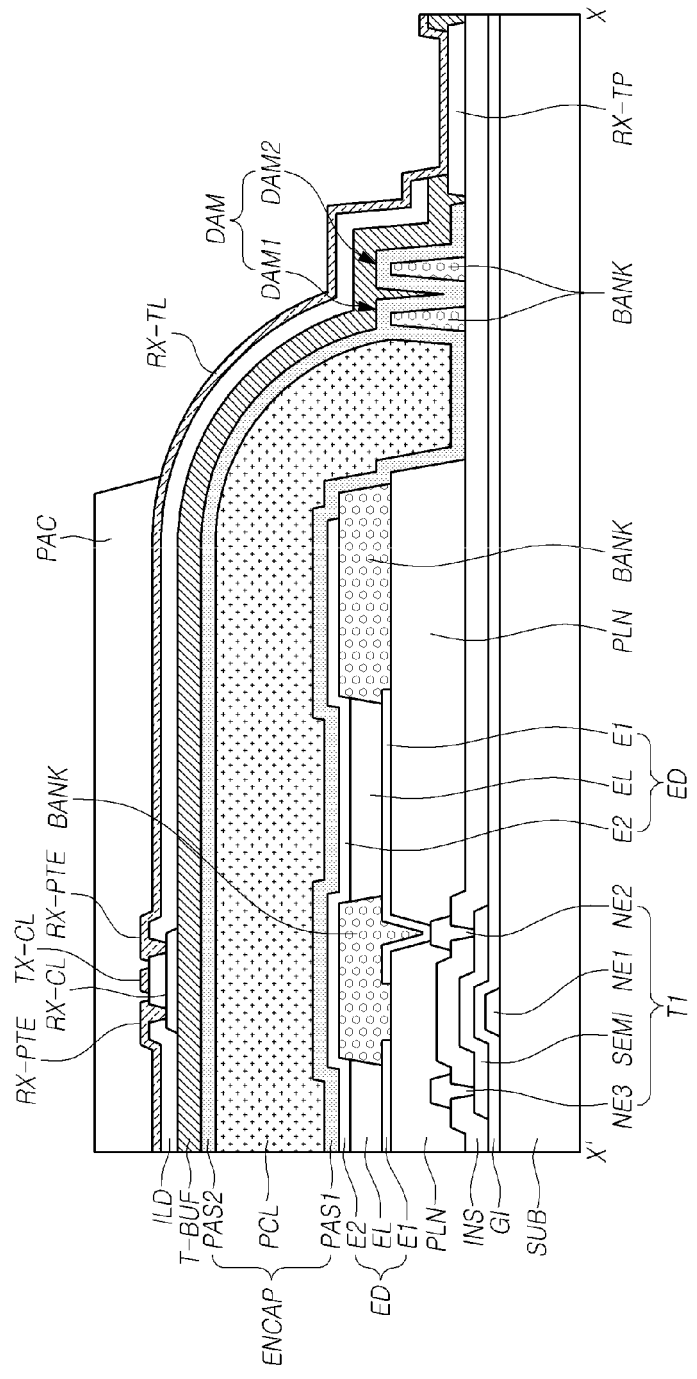
FIG. 9 is a partial cross-sectional view of the display panel according to embodiments of the present invention, taken along line X-X' in FIG. 8.

FIG. 9 is a partial cross-sectional view of the display panel according to embodiments of the present invention, taken along line X-X' in FIG. 8. In FIG. 9, the touch electrode (Y-TE) is illustrated in the form of a plate as an example, but the touch electrode (Y-TE) can be a mesh type.

The first transistor (T1) which is a driving transistor in each sub-pixel (SP) in the active area (AA) can be disposed on the substrate (SUB).

The first transistor (T1) can include the first node electrode (NE1) corresponding to the gate electrode, the second node electrode (NE2) corresponding to the source electrode or the drain electrode, the third node electrode (NE3) corresponding to the drain electrode or the source electrode, and the semiconductor layer (SEMI).

The first node electrode (NE1) and the semiconductor layer (SEMI) can be overlapped with each other with the gate insulation film (GI) interposed therebetween. The second node electrode (NE2) can be formed on the insulation layer (INS) and can contact to one side of the semiconductor layer (SEMI), and the third node electrode (NE3) can be formed on the insulation layer (INS) and can contact to the other side of the semiconductor layer (SEMI).

The light emitting element (ED) can include a first electrode (E1) corresponding to the anode electrode (or the cathode electrode), a light emitting layer (EL) formed on the first electrode (E1), and a second electrode (E2) corresponding to the cathode electrode (or the anode electrode) formed on the light emitting layer (EL).

The first electrode (E1) of the light emitting element (ED) can be also referred to as a pixel electrode and the second electrode (E2) of the light emitting element (ED) can be also referred to as a common electrode. The base voltage (VSS) applied to the common electrode can be also referred to as a common voltage.

The first electrode (E1) is electrically connected to the second node electrode (NE2) of the first transistor (T1) exposed through the pixel contact hole penetrating through the planarization layer (PLN).

The light emitting layer (EL) can be formed on the first electrode (E1) of the light emitting area provided by the bank (BANK). The light emitting layer (EL) can be formed by laminating the hole-related layer, the light emitting layer, and the electron-related layer on the first electrode (E1) in order or in the reverse order. The second electrode (E2) can be formed to face the first electrode (E1) with the light emitting layer (EL) therebetween.

The encapsulation layer (ENCAP) can block external moisture or oxygen from penetrating into the light emitting element (ED) being vulnerable to external moisture or oxygen.

The encapsulation layer (ENCAP) can be a single layer, but the encapsulation layer (ENCAP) can include a plurality of layers (PAS1, PCL, PAS2) as shown in FIG. 9.

For example, in the case that the encapsulation layer (ENCAP) comprises the plurality of layers (PAS1, PCL, PAS2), the encapsulation layer (ENCAP) can include one or more inorganic encapsulation layers (PAS1, PAS2) and one or more organic encapsulation layers (PCL). As a specific example, the encapsulation layer (ENCAP) can have a structure in which the first inorganic encapsulation layer (PAS1), the organic encapsulation layer (PCL) and the second inorganic encapsulation layer (PAS2) are sequentially laminated.

Here, the organic encapsulation layer (PCL) can further include at least one organic encapsulation layer or at least one inorganic encapsulation layer.

The first inorganic encapsulation layer (PAS1) can be formed on the substrate (SUB) on which the second electrode (E2) corresponding to the cathode electrode is formed so as to be closest to the light emitting element (ED). The first inorganic encapsulation layer (PAS1) can be formed of an inorganic material capable of low temperature deposition such as silicon nitride (SiNx), silicon oxide (SiOx), silicon oxynitride (SiON), or aluminum oxide (Al2O3). Since the first inorganic encapsulation layer PAS1 is deposited in a low-temperature atmosphere, the first inorganic encapsulation layer (PAS1) can prevent the damage to the light-emitting layer (EL) containing organic material being vulnerable to a high-temperature state during the deposition process.

The organic encapsulation layer (PCL) can be formed to have an area smaller than that of the first inorganic encapsulation layer (PAS1). As a result, the organic encapsulation layer (PCL) can be formed by exposing both ends of the first inorganic encapsulation layer (PAS1). The organic encapsulation layer (PCL) can serve as a buffer to mitigate the stress between the respective layers due to warping or bending of the touch display device as the organic light emitting display device, thereby can enhance the planarization performance. The organic encapsulation layer (PCL) can be formed of an organic insulating material such as an acrylic resin, an epoxy resin, polyimide, polyethylene, or silicon oxycarbon (SiOC).

In the case that the organic encapsulation layer (PCL) is formed by the inkjet method, one or more dams (DAMs) can be formed in the dam area (DA) corresponding to the boundary region between the non-active area (NA) and the active area (AA) or a part of the non-active area (NA).

For example, as shown in FIG. 9, the dam area (DA) can be located between the active area (AA) and the pad area where the plurality of first touch pads (TX-TP) and the plurality of second touch pads (RX-TP) are formed in the non-active area (NA). In this dam area (DA), there can be the first dam (DAM1) adjacent to the active area (AA) and the second dam DAM2 adjacent to the pad area.

One or more dams (DAM) disposed in the dam area (DA) can prevent the organic encapsulation layer (PCL) in the liquid phase from collapsing in the direction of the non-active area (NA) to invade the pad area when the organic encapsulation layer (PCL) in the liquid phase is dripped into the active area (AA).

This effect can be further increased in the case that the first dam (DAM1) and the second dam (DAM2) are provided as shown in FIG. 9.

The first dam (DAM1) and/or the second dam (DAM2) can be formed as a single layer structure or a multi-layer structure. For example, the first dam (DAM1) and/or the second dam (DAM2) can be formed of the same material as at least one of the banks (BANK) and the spacers (not shown). In this case, the dam structure can be formed without increasing the mask process and cost therefor.

The first dam (DAM1) or the second dam (DAM2) can be formed by a structure in which the first inorganic encapsulation layer (PAS1) and/or the second inorganic encapsulation layer (PAS2) is laminated on the bank (BANK) as shown FIG. 9.

In addition, the organic encapsulation layer (PCL) containing organic material can be located only on the inner surface of the first dam (DAM1) as shown in FIG. 9.

Alternatively, the organic encapsulation layer (PCL) containing organic material can be located at the upper portion of at least the first dam (DAM1) among the first dam (DAM1) and the second dam (DAM2).

The second inorganic encapsulation layer (PAS2) can be formed on the substrate (SUB) on which the organic encapsulation layer (PCL) is formed so as to cover the upper surface and side surfaces of the organic encapsulation layer (PCL) and the first inorganic encapsulation layer (PAS1). The second inorganic encapsulation layer (PAS2) can minimize or can block external moisture or oxygen from penetrating into the first inorganic encapsulation layer (PAS1) and the organic encapsulation layer (PCL). The second inorganic encapsulation layer (PAS2) can be formed of an inorganic insulating material such as silicon nitride (SiNx), silicon oxide (SiOx), silicon oxynitride (SiON) or aluminum oxide (Al2O3).

A touch buffer film (T-BUF) can be disposed on the encapsulation layer (ENCAP). The touch buffer film (T-BUF) can be located between the touch sensor metal including first and second touch electrodes (TX-TE, RX-TE) and first and second connection lines (TX-CL, RX-CL) and the second electrode (E2) of the light emitting element (ED).

The touch buffer film (T-BUF) can be designed such that the distance between the touch sensor metal and the second electrode (E2) of the light emitting element (ED) maintains a predetermined minimum separation distance (for example, 5 μm). Accordingly, it is possible to reduce or prevent the parasitic capacitance formed between the touch sensor metal and the second electrode (E2) of the light emitting element (ED), thereby preventing a decrease in touch sensitivity due to parasitic capacitance.

The touch sensor metal including the first and second touch electrodes (TX-TE, RX-TE) and the first and second connection lines (TX-CL, TX-CL) can be disposed on the encapsulation layer (ENCAP) without the touch buffer film (T-BUF).

Also, the touch buffer film (T-BUF) can prevent a chemical solution (developer or etchant or the like) used in the manufacturing process of the touch sensor metal disposed on the touch buffer film (T-BUF) or external moisture or the like from penetrating into the light-emitting layer (EL) including the organic material. Accordingly, the touch buffer film (T-BUF) can prevent the damage of the light emitting layer (EL) being vulnerable to the chemical liquid or moisture.

The touch buffer film (T-BUF) can be formed at a low temperature of a predetermined temperature (for example, 100° C.) or less to prevent damage to the light emitting layer (EL) containing the organic insulating material being vulnerable to high temperature, and can be formed of an organic insulating material having a low dielectric constant of 1 to 3. For example, the touch buffer film (T-BUF) can be formed of an acrylic-based material, epoxy-based material or siloxane-based material. The touch buffer film (T-BUF) having a planarizing property as an organic insulating material can prevent the damage of the respective encapsulation layer (PAS1, PCL, PAS2) in the encapsulation layer (ENCAP) due to bending of the organic light emitting display device. The touch buffer film (T-BUF) can also prevent the breakage of the touch sensor metal formed on the touch buffer film (T-BUF).

According to the mutual capacitance-based touch sensor structure, the first touch electrode (TX-TE) and the second touch electrode (RX-TE) are disposed on the touch buffer film (T-BUF), and the first touch electrode (TX-TE) and the second touch electrode (RX-TE) can be arranged so as to intersect with each other.

The second touch electrode (RX-TE) can include the plurality of second division touch electrodes (RX-PTE) and the plurality of second connection lines (RX-CL) electrically connecting the plurality of second division touch electrodes (RX-PTE).

As shown in FIG. 9, the plurality of second division touch electrodes (RX-PTE) and the plurality of second connection lines (RX-CL) can be located on different layers with the touch insulation film (ILD) interposed therebetween.

The plurality of second division touch electrodes (RX-PTE) can be spaced apart from each other at regular intervals along the y-axis direction. Each of the plurality of second division touch electrodes (RX-PTE) can be electrically connected to another second division touch electrode (RX-PTE) adjacent in the y-axis direction through the second connection line (RX-CL).

The second connection line (RX-CL) can be formed on the touch buffer film (T-BUF) and can be exposed through the touch contact hole penetrating through the touch insulation film (ILD) and can be electrically connected to two second division touch electrodes (RX-PTE) adjacent in the y-axis direction.

The second connection line (RX-CL) can be arranged so as to overlap with the bank (BANK). Accordingly, it is possible to prevent the aperture ratio from being lowered by the second connection line (RX-CL).

The first touch electrode (TX-TE) can include the plurality of first division touch electrodes (TX-PTE) and the plurality of first connection lines (TX-CL) for electrically connecting the plurality of first division touch electrodes (TX-PTE). The plurality of first division touch electrodes (TX-PTE) and the plurality of first connection lines (TX-CL) can be located on different layers with the touch insulation film (ILD) therebetween.

The plurality of first division touch electrodes (TX-PTE) can be spaced apart from each other at regular intervals along the x-axis direction on the touch insulation film (ILD). Each of the plurality of first division touch electrodes (TX-PTE) can be electrically connected to another first division touch electrode (TX-PTE) in the x-axis direction through the first connection line (TX-CL).

The first connection line (TX-CL) can be disposed on the same plane as the first division touch electrode (TX-PTE). Accordingly, The first connection line (TX-CL) can be connected to two first division touch electrodes (TX-PTE) adjacent to each other in the x-axis direction without the additional contact hole, or can be integrated with the first division touch electrode (TX-PTE).

The first connection line (TX-CL) can be arranged so as to overlap with the bank (BANK). Accordingly, it is possible to prevent the aperture ratio from being lowered by the first connection line (TX-CL).

The second touch electrode (RX-TE) can be electrically connected to the touch circuit (TC) through the second touch routing line (RX-TL) and the second touch pad (RX-TP). Similarly, the first touch electrode (TX-TE) can be electrically connected to the touch circuit (TC) through the first touch routing line (TX-TL) and the first touch pad (TX-TP).

A pad cover electrode covering the first touch pad (TX-TP) and the second touch pad (RX-TP) can be further disposed.

The first touch pad (TX-TP) can be formed separately from the first touch routing line (TX-TL) or can be formed by extending the first touch routing line (TX-TL). The second touch pad (RX-TP) can be formed separately from the second touch routing line (RX-TL) or can be formed by extending the second touch routing line (RX-TL).

In the case that the first touch pad (TX-TP) is formed by extending the first touch routing line (TX-TL) and the second touch pad (RX-TP) is formed by extending the second touch routing line (RX-TL), the first touch pad (TX-TP), the first touch routing line (TX-TL), the second touch pad (RX-TP) and the second touch routing line (RX-TL) can be formed of the same material of the first conductive material. Here, the first conductive material can be formed by a single layer structure or a multi-layer structure using a metal having high corrosion resistance, acid resistance and good conductivity properties, such as Al, Ti, Cu, and Mo.

For example, the first touch pad (TX-TP), the first touch routing line (TX-TL), the second touch pad (RX-TP) and the second touch routing line (RX-TL) can be formed by a laminated three-layer structure such as Ti/Al/Ti or Mo/Al/Mo.

The pad cover electrode capable of covering the first touch pad (TX-TP) and the second touch pad (RX-TP) can be formed of the same material of the second conductive material as the first and second touch electrodes (TX-TE, RX-TE). Here, the second conductive material can be a transparent conductive material such as ITO or IZO having high corrosion resistance and acid resistance properties. The pad cover electrode can be bonded to the touch circuit (TC) or can be bonded to a circuit film on which the touch circuit TC is mounted by being formed to be exposed by the touch buffer film (T-BUF).

Here, the touch buffer film (T-BUF) is formed to cover the touch sensor metal, thereby preventing the touch sensor metal from being corroded by external moisture or the like. For example, the touch buffer film (T-BUF) can be formed of an organic insulating material, or can be formed as a circular polarizer or a film of epoxy or acrylic material. Such a touch buffer film (T-BUF) need not be on the encapsulation layer (ENCAP). That is, the touch buffer film (T-BUF) need not be an essential element.

The second touch routing line (RX-TL) can be electrically connected to the second division touch electrode (RX-PTE) through the touch routing line contact hole, or can be formed by being integrated with the second division touch electrode (RX-PTE).

The second touch routing line (RX-TL) can be extended to the non-active area (NA) and can be electrically connected to the second touch pad (RX-TP) located in the non-active area (NA) by passing over the top and sides of the encapsulation layer (ENCAP) and the top and sides of the dam (DAM). Accordingly, the second touch routing line (RX-TL) can be electrically connected to the touch circuit (TC) through the second touch pad (RX-TP).

The second touch routing line (RX-TL) can transfer the sensing signal from the second division touch electrode (RX-PTE) to the touch circuit (TC) or can transfer the driving signal supplied from the touch circuit (TC) to the second division touch electrode (RX-PTE).

The first touch routing line (TX-TL) can be electrically connected to the first division touch electrode (RX-PTE) through the touch routing line contact hole, or can be formed by being integrated with the first division touch electrode (TX-PTE).

The first touch routing line (TX-TL) can be extended to the non-active area (NA) and can be electrically connected to the first touch pad (TX-TP) located in the non-active area (NA) by passing over the top and sides of the encapsulation layer (ENCAP) and the top and sides of the dam (DAM). Accordingly, the first touch routing line (TX-TL) can be electrically connected to the touch circuit (TC) through the first touch pad (TX-TP).

The first touch routing line (TX-TL) can receive the driving signal from the touch circuit (TC) and can transfer the driving signal to the first division touch electrode (TX-PTE). The first touch routing line (TX-TL) can transfer the sensing signal from the first division touch electrode (TX-PTE) to the touch circuit (TC).

The arrangement of the first touch routing line (TX-TL) and the second touch routing line (RX-TL) can be variously modified depending on the design requirement of the panel.

The touch protection film (PAC) can be disposed on the first division touch electrode (TX-PTE) and the second division touch electrode (RX-PTE). The touch protection film (PAC) can be extended before or after the dam (DAM) so as to be also disposed on the first touch routing line (TX-TL) and the second touch routing line (RX-TL).

The cross-sectional view of FIG. 9 conceptually illustrates the structure. Therefore, the position, thickness or width of each pattern (various layers or electrodes) can vary depending on the viewing direction or the observation position. In addition, the connection structure of various patterns can also be changed, and there can be additional layers other than the illustrated layers, and some of the layers illustrated can be omitted or integrated. For example, the width of the bank (BANK) can be narrower than the case of the drawing, and the height of the dam (DAM) can be lower or higher than the drawing.

As shown in FIG. 8, in the case that each of the plurality of first touch electrodes (TX-TE) is formed by electrically connecting the plurality of first division touch electrodes (TX-PTE) and each of the plurality of second touch electrodes (RX-TE) is formed by electrically connecting the plurality of second division touch electrodes (RX-PTE), each of the plurality of first division touch electrodes (TX-PTE) can be also referred to as a first touch electrode (TX-TE) or a touch electrode (TE) and each of the plurality of second division touch electrodes (RX-PTE) can be also referred to as a second touch electrode (RX-TE) or a touch electrode (TE) as described below.

Figure 10:
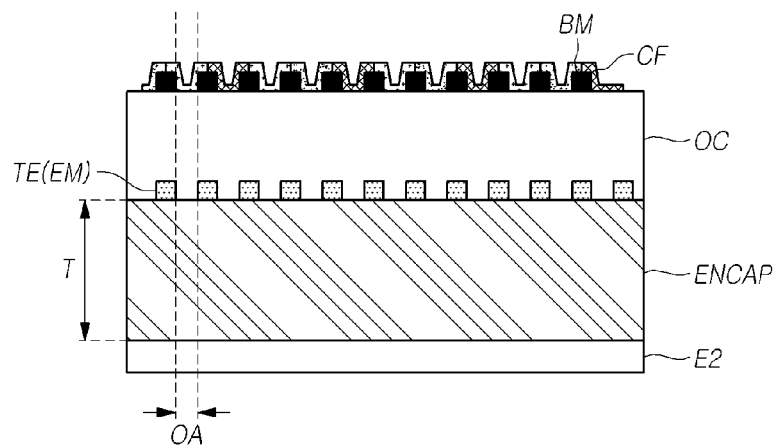
FIGS. 10 and 11 are example diagrams illustrating the cross-sectional structure of the display panel including a color filter according to embodiments of the present invention.
Figure 11:
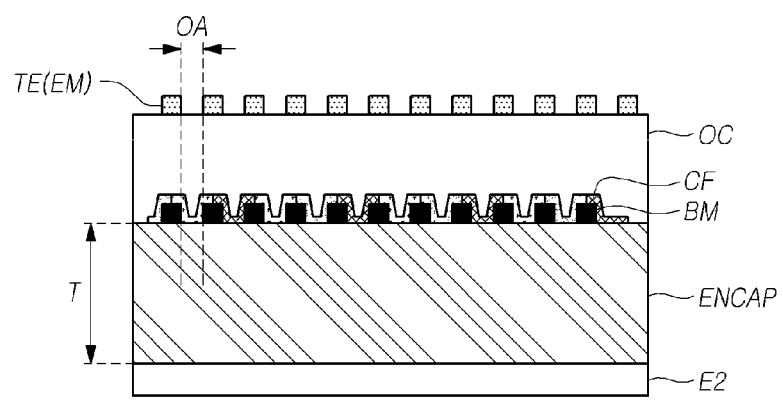

FIGS. 10 and 11 are example diagrams illustrating the cross-sectional structure of the display panel including a color filter according to embodiments of the present invention.

Referring to FIGS. 10 and 11, in the case that the touch panel (TSP) is embedded in the display panel (DISP) and the display panel (DISP) is implemented as an organic light emitting display panel, the touch panel (TSP) can be positioned on the encapsulation layer (ENCAP) in the display panel (DISP). That is, the touch sensor metal such as the plurality of touch electrodes (TE) and a plurality of touch routing lines (TL) can be positioned on the encapsulation layer (ENCAP) in the display panel (DISP).

As described above, the touch electrodes (TE) can be formed without greatly affecting the display performance and the display-related layer formation by forming the touch electrodes (TE) on the encapsulation layer (ENCAP).

Referring to FIGS. 10 and 11, the second electrode (E2) which can be the cathode electrode of the organic light emitting diode (OLED) can be located under the encapsulation layer (ENCAP).

The thickness (T) of the encapsulation layer (ENCAP) can be, for example, 5 μm or more.

As described above, since the thickness of the encapsulation layer (ENCAP) is designed to be 5 μm or more, it is possible to reduce the parasitic capacitance formed between the second electrode (E2) of the organic light emitting diode (OLED) and the touch electrodes (TE). Thus, it is possible to prevent the decrease in touch sensitivity due to the parasitic capacitance.

As described above, in each of the plurality of touch electrodes (TE), the electrode metal (EM) can be patterned in the form of the mesh type having two or more openings (OA), and each of the two or more openings (OA) can correspond to one or more subpixels or their light emitting regions in viewing in a vertical direction.

As described above, since the touch electrode (TE) can be formed by pattering the electrode metal (EM) in which the light emitting region of one or more subpixels corresponds to the position of each of the two or more openings (OA) existing in the region of the touch electrode (TE), it is possible to increase the luminous efficiency of the display panel (DISP).

As shown in FIGS. 10 and 11, a black matrix (BM) can be disposed on the display panel (DISP), and a color filter (CF) can further be disposed on the display panel (DISP).

The position of the black matrix (BM) can correspond to the position of the electrode metal (EM) of the touch electrode (TE).

The positions of the plurality of color filters (CF) can correspond to the positions of the plurality of touch electrodes (TE) or the electrode metals (EM) forming the plurality of touch electrodes (TE).

As described above, since the plurality of color filters (CF) are located at positions corresponding to the positions of the plurality of openings (OA), the light emitting performance of the display panel (DISP) can be enhanced.

The vertical positional relationship between the plurality of color filters (CF) and the plurality of touch electrodes (TE) will now be described.

As shown in FIG. 10, the plurality of color filters (CF) and the black matrix (BM) can be located on the plurality of touch electrodes (TE).

In this case, the plurality of color filters (CF) and the black matrix (BM) can be located on the overcoat layer (OC) disposed on the plurality of touch electrodes (TE). Here, the overcoat layer (OC) can be the same layer as the touch protection film (PAC) of FIG. 9 or can be another layer.

As shown in FIG. 11, the plurality of color filters (CF) and the black matrix (BM) can be located under the plurality of touch electrodes (TE).

In this case, the plurality of touch electrodes (TE) can be located on the overcoat layer (OC) disposed on the plurality of color filters (CF) and the black matrix (BM). Here, the overcoat layer (OC) can be the same layer as the touch buffer film (T-BUF) or the touch insulation film (ILD) of FIG. 9 or can be another layer.

Figure 12:
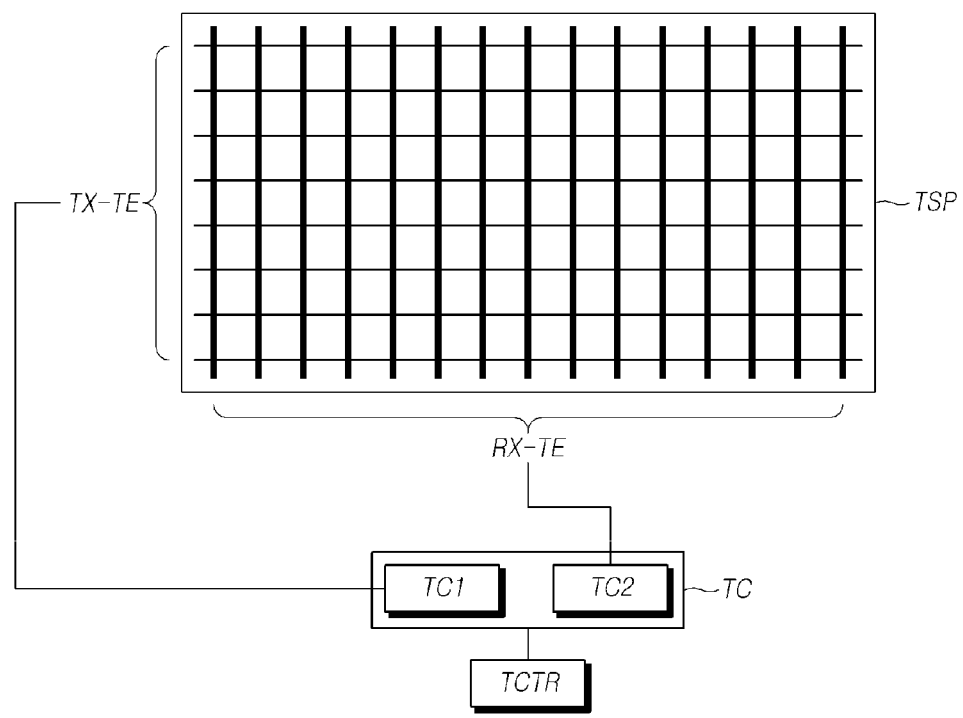
FIG. 12 is a schematic configuration diagram of the touch system according to embodiments of the present invention.

FIG. 12 is a schematic configuration diagram of the touch system according to embodiments of the present invention.

Referring to FIG. 12, the touch system according to the embodiments of the present invention can include the touch panel (TSP), the touch circuit (TC) for driving the touch panel (TSP) and sensing the touch, and the touch controller (TCTR) that senses the touch using the touch panel (TSP) sensing result of the touch circuit (TC).

Referring to FIG. 12, the plurality of touch electrodes (TX-TE, RX-TE) can be disposed on the touch panel (TSP). The plurality of touch electrodes (TX-TE, RX-TE) corresponds to a kind of sensor for sensing finger touch and/or pen touch.

Referring to FIG. 12, the plurality of touch electrodes (TX-TE, RX-TE) can include the plurality of first touch electrodes (TX-TE) and the plurality of second touch electrodes (RX-TE).

Referring to FIG. 12, each of the plurality of first touch electrodes (TX-TE) can be disposed in a first direction, and each of the plurality of second touch electrodes (RX-TE) can be disposed in a second direction, or vice versa.

Referring to FIG. 12, each of the plurality of first touch electrodes (TX-TE) can be a bar-shaped electrode as shown in FIG. 7, or can be an electrode assembly divided into several parts as shown in FIG. 8. Similarly, each of the plurality of second touch electrodes (RX-TE) can also be a bar-shaped electrode as shown in FIG. 7 or can be an electrode assembly divided into several parts as shown in FIG. 8.

Referring to FIG. 12, each of the plurality of first touch electrodes (TX-TE) can be disposed in a first direction, and each of the plurality of second touch electrodes (RX-TE) can be disposed in a second direction, or vice versa.

The first touch electrode (TX-TE) and the second touch electrode (RX-TE) can be located on different layers or on the same layer.

The first touch electrode (TX-TE) and the second touch electrode (RX-TE) can be a plate-shaped electrode having no open area or a mesh-shaped electrode having open areas. Here, each of the open areas existing in one touch electrode can correspond to one or more subpixels or the light emitting region of the subpixel.

The touch circuit (TC) can include a first touch circuit (TC1) electrically connected to the plurality of first touch electrodes (TX-TE) and a second touch circuit (TC2) electrically connected to the plurality of second touch electrodes (RX-TE) and the like.

Each of the plurality of first touch electrodes (TX-TE) can be a driving touch electrode, and each of the plurality of second touch electrodes (RX-TE) can be a sensing touch electrode. Conversely, each of the plurality of first touch electrodes (TX-TE) can be the sensing touch electrode, and each of the plurality of second touch electrodes (RX-TE) can be the driving touch electrode. Also, the plurality of first touch electrodes (TX-TE) can simultaneously serve as both the driving touch electrodes and the sensing touch electrodes, and the plurality of second touch electrodes (RX-TE) can simultaneously serve as both the driving touch electrodes and the sensing touch electrodes.

In the following description of FIGS. 13-15, for convenience of explanation, it is assumed that the plurality of first touch electrodes (TX-TE) are driving touch electrodes and the plurality of second touch electrodes (RX-TE) are sensing touch electrodes.

Figure 13:
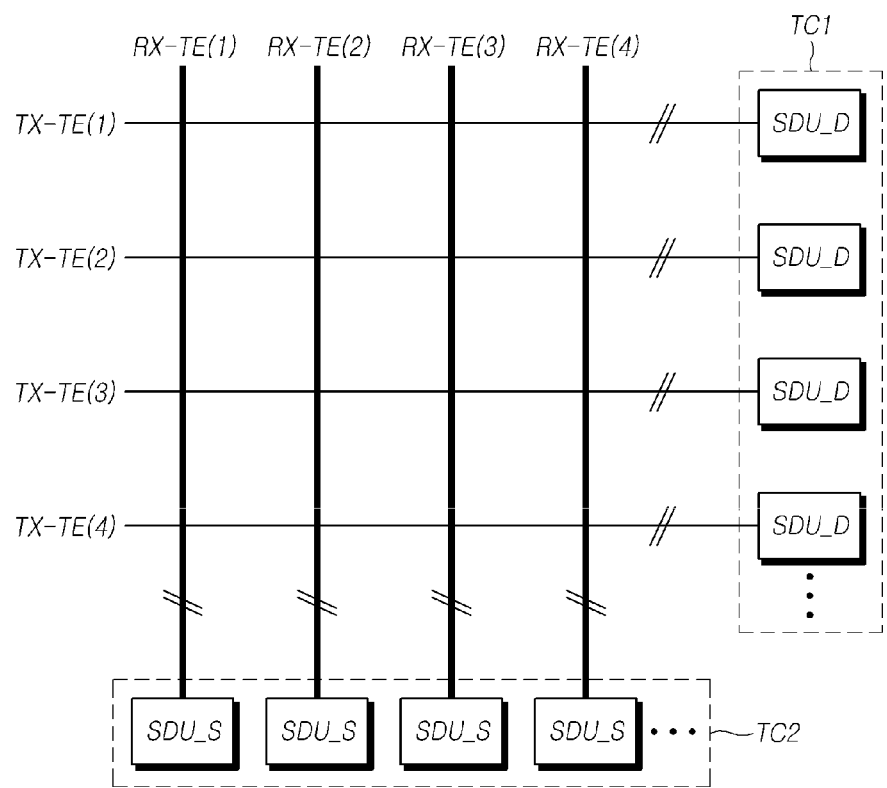
FIG. 13 is a diagram illustrating a first touch circuit and a second touch circuit in the touch circuit of the touch system according to embodiments of the present invention.

FIG. 13 is a diagram illustrating a first touch circuit and a second touch circuit in the touch circuit of the touch system according to embodiments of the present invention.

Referring to FIG. 13, the touch circuit (TC) can include the first touch circuit (TC1) electrically connected to the plurality of first touch electrodes (TX-TE) and the second touch circuit (TC2) electrically connected to the plurality of second touch electrodes (RX-TE)

The touch system according to embodiments of the present invention can sense the touch (finger touch, pen touch) based on the mutual capacitance or based on the self capacitance, or can sense the touch (finger touch, pen touch) based on both the mutual capacitance and the self capacitance.

In the case that the touch system according to the embodiments of the present invention senses touch based on the mutual capacitance, one of the first touch circuit (TC1) and the second touch circuit (TC2) can be a driving circuit and the other can be a sensing circuit.

Accordingly, the touch system according to embodiments of the present invention can provide various operation cases and various sensing modes. Below, five cases will be described.

Case 1 is a case in which the first touch circuit (TC1) operates as the driving circuit for mutual capacitance sensing and the second touch circuit (TC2) operates as the sensing circuit for mutual capacitance sensing.

In this case, the first touch circuit (TC1) can drive or operate all or a part of the plurality of first touch electrodes (TX-TE(1), TX-TE(2), TX-TE(3), TX-TE(4), . . . ). The second touch circuit (TC2) can sense all or a part of the plurality of second touch electrodes (RX-TE(1), RX-TE(2), RX-TE(3), RX-TE(4), . . . ).

That is, the first touch circuit (TC1) can simultaneously or sequentially supply the driving signals to all or a part of the plurality of first touch electrodes (TX-TE(1), TX-TE(2), TX-TE(3), TX-TE(4), . . . ). The second touch circuit (TC2) can simultaneously or sequentially detect the sensing signal from all or a part of the plurality of second touch electrodes (RX-TE(1), RX-TE(2), RX-TE(3), RX-TE(4), . . . ).

Here, the sensing signal can be a signal which reflects a mutual capacitance formed between each of the plurality of second touch electrodes (RX-TE(1), RX-TE(2), RX-TE(3), RX-TE(4), . . . ) and the plurality of first touch electrodes (TX-TE(1), TX-TE(2), TX-TE(3), TX-TE(4), . . . ).

Case 2 is the case of a mutual capacitance sensing mode in which the first touch circuit (TC1) operates as the sensing circuit for the mutual capacitance sensing and the second touch circuit (TC2) operates as the driving circuit for the mutual capacitance sensing.

In this case, the second touch circuit (TC2) can drive or operate all or a part of the plurality of second touch electrodes (RX-TE(1), RX-TE(2), RX-TE(3), RX-TE(4), . . . ). The first touch circuit (TC1) can sense all or a part of the plurality of first touch electrodes (TX-TE(1), TX-TE(2), TX-TE(3), TX-TE(4), . . . ).

That is, The second touch circuit (TC2) can simultaneously or sequentially supply the driving signals to all or a part of the plurality of second touch electrodes (RX-TE(1), RX-TE(2), RX-TE(3), RX-TE(4), . . . ). The first touch circuit (TC1) can simultaneously or sequentially detect the sensing signal from all or a part of the plurality of first touch electrodes (TX-TE(1), TX-TE(2), TX-TE(3), TX-TE(4), . . . ).

Here, the sensing signal can be a signal which reflects a mutual capacitance formed between each of the plurality of first touch electrodes (TX-TE(1), TX-TE(2), TX-TE(3), TX-TE(4), . . . ) and the plurality of second touch electrodes (RX-TE(1), RX-TE(2), RX-TE(3), RX-TE(4), . . . ).

Case 3 is the case of a mixed sensing mode (mutual capacitance sensing mode, self capacitance sensing mode) in which the first touch circuit (TC1) operates as the driving circuit for the mutual capacitance sensing and the second touch circuit (TC2) operates as the sensing circuit for the mutual capacitance sensing, and the second touch circuit (TC2) further operates as the driving circuit and the sensing circuit for the self capacitance sensing.

In this case, the first touch circuit (TC1) can drive all or a part of the plurality of first touch electrodes (TX-TE(1), TX-TE(2), TX-TE(3), TX-TE(4), . . . ). The second touch circuit (TC2) can drive and sense all or a part of the plurality of second touch electrodes (RX-TE(1), RX-TE(2), RX-TE(3), RX-TE(4), . . . ).

That is, the first touch circuit (TC1) can simultaneously or sequentially supply the driving signals (the driving signal for sensing the mutual capacitance) to all or a part of the plurality of first touch electrodes (TX-TE(1), TX-TE(2), TX-TE(3), TX-TE(4), . . . ). The second touch circuit (TC2) can simultaneously or sequentially supply the driving signals (the driving signal for sensing the self capacitance) to all or a part of the plurality of second touch electrodes (RX-TE(1), RX-TE(2), RX-TE(3), RX-TE(4), . . . ).

The second touch circuit (TC2) can also simultaneously or sequentially detect the sensing signal from all or a part of the plurality of second touch electrodes (RX-TE(1), RX-TE(2), RX-TE(3), RX-TE(4), . . . ).

Here, the sensing signal can be a signal which reflects both the mutual capacitance formed between each of the plurality of second touch electrodes (RX-TE(1), RX-TE(2), RX-TE(3), RX-TE(4), . . . ) and the plurality of first touch electrodes (TX-TE(1), TX-TE(2), TX-TE(3), TX-TE(4), . . . ) and self capacitance formed on each of the plurality of second touch electrodes (RX-TE(1), RX-TE(2), RX-TE(3), RX-TE(4), . . . ).

Case 4 is the case of a mixed sensing mode (mutual capacitance sensing mode, self capacitance sensing mode) in which the second touch circuit (TC2) operates as the driving circuit for the mutual capacitance sensing and the first touch circuit (TC1) operates as the sensing circuit for the mutual capacitance sensing, and the first touch circuit (TC1) further operates as the driving circuit and the sensing circuit for the self capacitance sensing.

In this case, the second touch circuit (TC2) can drive all or a part of the plurality of second touch electrodes (RX-TE(1), RX-TE(2), RX-TE(3), RX-TE(4), . . . ). The first touch circuit (TC1) can drive and sense all or a part of the plurality of first touch electrodes (TX-TE(1), TX-TE(2), TX-TE(3), TX-TE(4), . . . ).

That is, the second touch circuit (TC2) can simultaneously or sequentially supply the driving signals (the driving signal for sensing the mutual capacitance) to all or a part of the plurality of second touch electrodes (RX-TE(1), RX-TE(2), RX-TE(3), RX-TE(4), . . . ). The first touch circuit (TC1) can simultaneously or sequentially supply the driving signals (the driving signal for sensing the self capacitance) to all or a part of the plurality of first touch electrodes (TX-TE(1), TX-TE(2), TX-TE(3), TX-TE(4), . . . ).

The first touch circuit (TC1) can also simultaneously or sequentially detect the sensing signal from all or a part of the plurality of first touch electrodes (TX-TE(1), TX-TE(2), TX-TE(3), TX-TE(4), . . . ).

Here, the sensing signal can be a signal which reflects both the mutual capacitance formed between each of the plurality of first touch electrodes (TX-TE(1), TX-TE(2), TX-TE(3), TX-TE(4), . . . ) and the plurality of second touch electrodes (RX-TE(1), RX-TE(2), RX-TE(3), RX-TE(4), . . . ) and the self capacitance formed on each of the plurality of first touch electrodes (TX-TE(1), TX-TE(2), TX-TE(3), TX-TE(4), . . . ).

Case 5 is the case of the self capacitance sensing mode in which the first touch circuit (TC1) operates as the driving circuit and the sensing circuit for the self capacitance sensing and the second touch circuit (TC2) also operates as the the driving circuit and the sensing circuit for the self capacitance sensing.

The first touch circuit (TC1) can simultaneously or sequentially supply the driving signals to all or a part of the plurality of first touch electrodes (TX-TE(1), TX-TE(2), TX-TE(3), TX-TE(4), . . . ), and can simultaneously or sequentially detect the sensing signal from all or a part of the plurality of first touch electrodes (TX-TE(1), TX-TE(2), TX-TE(3), TX-TE(4), . . . ).

Here, the sensing signal can be a signal which reflects self capacitance formed on each of the plurality of first touch electrodes (TX-TE(1), TX-TE(2), TX-TE(3), TX-TE(4), . . . ).

Similarly, the second touch circuit (TC2) can simultaneously or sequentially supply the driving signals to all or a part of the plurality of second touch electrodes (RX-TE(1), RX-TE(2), RX-TE(3), RX-TE(4), . . . ) and can simultaneously or sequentially detect the sensing signal from all or a part of the plurality of second touch electrodes (RX-TE(1), RX-TE(2), RX-TE(3), RX-TE(4), . . . ).

Here, the sensing signal can be a signal which reflects self capacitance formed on each of the plurality of second touch electrodes (RX-TE(1), RX-TE(2), RX-TE(3), RX-TE(4), . . . ).

Referring to FIG. 13, the first touch circuit (TC1) can include a plurality of first sensing driving units (SDU_D) electrically connected to the plurality of first touch electrodes (TX-TE(1), TX-TE(2), TX-TE(3), TX-TE(4), . . . ). The second touch circuit (TC2) can include a plurality of second sensing driving units (SDU_S) electrically connected to the plurality of second touch electrodes (RX-TE (1), RX-TE(2), RX-TE(3), RX-TE(4), . . . ).

The operation of each of the first sensing driving unit (SDU_D) and the second sensing driving unit (SDU_S) can be different depending on which one of the five cases the touch system according to embodiments of the present invention operates.

Furthermore, the internal configuration of the first sensing driving unit (SDU_D) and the second sensing driving unit (SDU_S) can be different depending on which one of the five cases the touch system according to the embodiments of the present invention operates.

Hereinafter, for convenience of explanation, the case 1 will be mainly described among the five cases.

Figure 14:
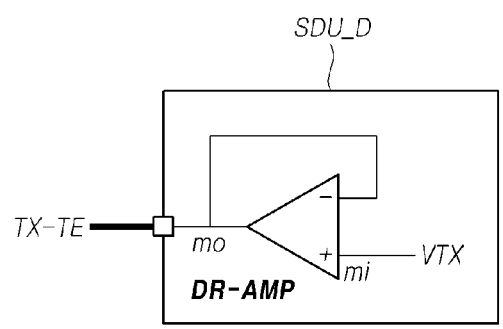
FIG. 14 is an example diagram of a first sensing driving unit included in the first touch circuit in the touch circuit of the touch system according to embodiments of the present invention.

FIG. 14 is an example diagram of a first sensing driving unit (SDU_D) included in the first touch circuit (TC1) in the touch circuit of the touch system according to embodiments of the present invention.

Referring to FIG. 14, each of the plurality of first sensing driving units (SDU_D) included in the first touch circuit (TC1) can include a driving amplifier (DR-AMP) for outputting driving signals to the first touch electrode (TX-TE).

The driving amplifier (DR-AMP) can include an input terminal (mi) for inputting the driving signal (VTX) and an output terminal (mo) for outputting the amplified driving signal (VTX).

The driving amplifier (DR-AMP) can output the driving signal (VTX) having a large amplitude, thereby enabling more efficient driving of the first touch electrode (TX-TE).

Figure 15:
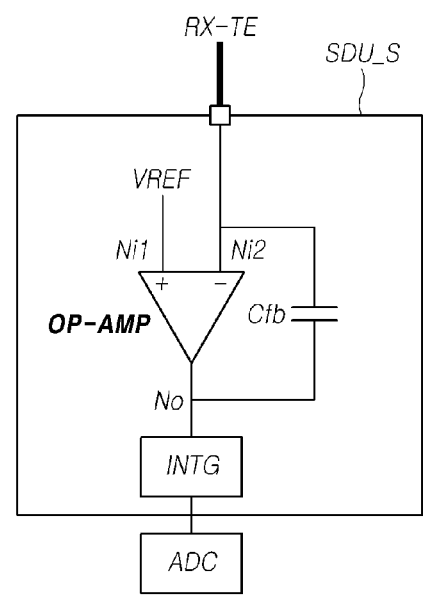
FIG. 15 is an example diagram of a second sensing driving unit included in the second touch circuit in the touch circuit of the touch system according to embodiments of the present invention.

FIG. 15 is an example diagram of a second sensing driving unit (SDU_S) included in the second touch circuit (TC2) in the touch circuit (TC) of the touch system according to embodiments of the present invention.

Each of the plurality of second sensing driving units (SDU_S) included in the second touch circuit (TC2) can include an operational amplifier (OP-AMP) electrically connected to the second touch electrode (RX-TE), and an integrator (INTG) electrically connected to the output (No) of the operational amplifier (OP-AMP). The output terminal of the integrator (INTG) can be connected to an analog-to-digital converter (ADC).

The operational amplifier (OP-AMP) can include a first input terminal (Ni1) receiving the reference voltage (VREF), a second input terminal (Ni2) electrically connected to the corresponding second touch electrode (RX-TE), and an output terminal (No) for outputting the output signal.

A feedback capacitor (Cfb) can be connected between the second input terminal (Ni2) and the output terminal (No) of the operational amplifier (OP-AMP). A resistor or the like can be further connected between the second input terminal (Ni2) and the output terminal (No) of the operational amplifier (OP-AMP).

It can be referred to as a charge amplifier or a pre-amplifier, including the operational amplifier (OP-AMP) and the feedback capacitor (Cfb).

Figure 16:
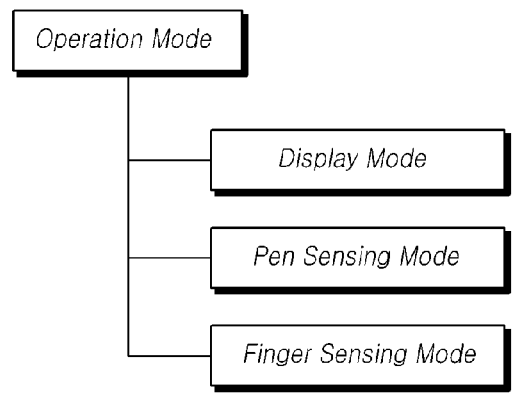
FIG. 16 is a diagram illustrating operation modes of the touch display device according to embodiments of the present invention.

FIG. 16 is a diagram illustrating operation modes of the touch display device according to embodiments of the present invention.

Referring to FIG. 16, the operation modes of the touch display device according to embodiments of the present invention can include the display mode, the finger sensing mode, and the pen sensing mode.

The display mode, the finger sensing mode and the pen sensing mode can be performed in different time zones. Alternatively, the display mode, the finger sensing mode and the pen sensing mode can be performed independently, can be performed simultaneously, or can be performed at different time zone.

For example, the finger sensing mode and/or the pen sensing mode can be performed during the display mode is performed (that is, during the image is displayed).

Figure 17:
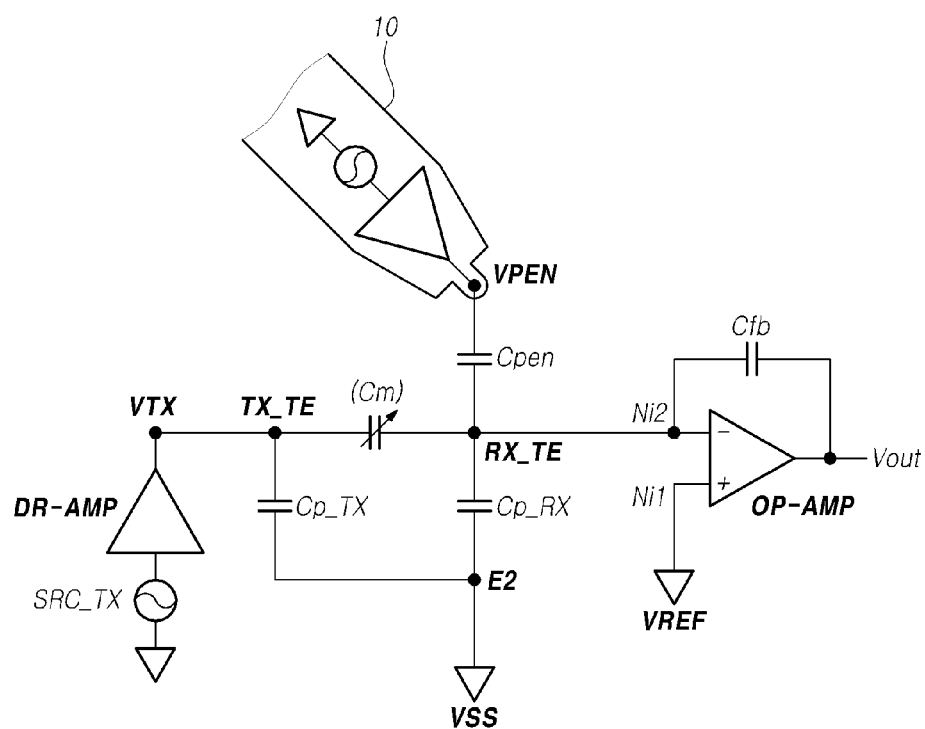
FIG. 17 is a diagram illustrating the circuit related to the sensing operation of the touch display device according to the embodiments of the present invention.
Figure 18:
FIG. 18 is a diagram illustrating main signals used for the touch display device according to embodiments of the present invention.

FIG. 17 is a diagram illustrating the circuit related to the sensing operation of the touch display device according to the embodiments of the present invention, and FIG. 18 is a diagram illustrating main signals (VREF, VTX, VPEN, etc.) used for the touch display device according to embodiments of the present invention.

Referring to FIG. 17, in the operational amplifier (OP-AMP) of the touch circuit (TC), the first input terminal (Ni1) can receive the reference voltage (VREF) and the second input terminal (Ni2) can be electrically connected to the second touch electrode (RX-TE) as the sensing touch electrode. In the operational amplifier (OP-AMP), the feedback capacitor (Cfb) can be electrically connected between the output terminal (No) for outputting the output voltage (Vout) and the second input terminal (Ni2) to which the second touch electrode (RX-TE) is electrically connected.

Referring to FIG. 17, the driving signal (VTX) generated from the driving signal source (SRC_TX) can be amplified through the driving amplifier (DR-AMP) and can be applied to the first touch electrode TX-TE, and the pen signal (VPEN) outputted from the pen 10 can be applied to the second touch electrode (RX-TE). At this time, various capacitances (Cm, Cp_TX, Cp_RX, and Cpen) can be formed on the display panel (DISP).

The mutual capacitance (Cm) can be formed between the first touch electrode (TX-TE) serving as the driving touch electrode and the second touch electrode (RX-TE) serving as the sensing touch electrode. The mutual capacitance (Cm) can be used for finger sensing, and the amount of the mutual capacitance can change depending on the finger position.

The pen capacitance (Cpen) to be sensed for pen sensing can be formed between the pen tip of the pen 10 outputting the pen signal (VPEN) and the second touch electrode (RX-TE) serving as the sensing touch electrode.

Referring to FIG. 17, the parasitic capacitance (Cp_TX) can be formed between the common electrode (E2) disposed on the display panel (DISP) and required for driving the display and the first touch electrode (TX-TE) as the driving touch electrode.

Similarly, the parasitic capacitance (Cp_RX) can be formed between the common electrode (E2) disposed on the display panel (DISP) and is required for driving the display and the second touch electrode (RX-TE) as the driving touch electrode.

The driving signal (VTX) can be a DC voltage or can be a modulation signal depending on the operating mode. For example, the driving signal (VTX) can be the DC voltage in the pen sensing mode, and the driving signal (VTX) can be the modulation signal (AC signal) whose voltage is variable in the finger sensing mode.

Referring to FIG. 18, the pen signal (VPEN) output from the pen 10 can be the signal whose voltage is variable in the case of the pen sensing mode. In this case, the signal waveform of the pen signal (VPEN) can be a sinusoidal wave, or can be a rectangular wave or a triangular wave as well.

The pen signal (VPEN) can be a signal in which the voltage swings regularly between a high level and a low level for a certain period of time. That is, the pen signal (VPEN) can be a signal having a constant frequency.

The pen signal VPEN can be a signal whose voltage swings irregularly between a high level and a low level during another period of time. That is, the pen signal (VPEN) can be a signal having no constant frequency.

In the pen sensing mode, the reference voltage (VREF) applied to the first input terminal (Ni1) of the operational amplifier (OP-AMP) and the driving signal (VTX) applied to the first touch electrode (TX-TE) can be a DC voltage signal.

Figure 19:
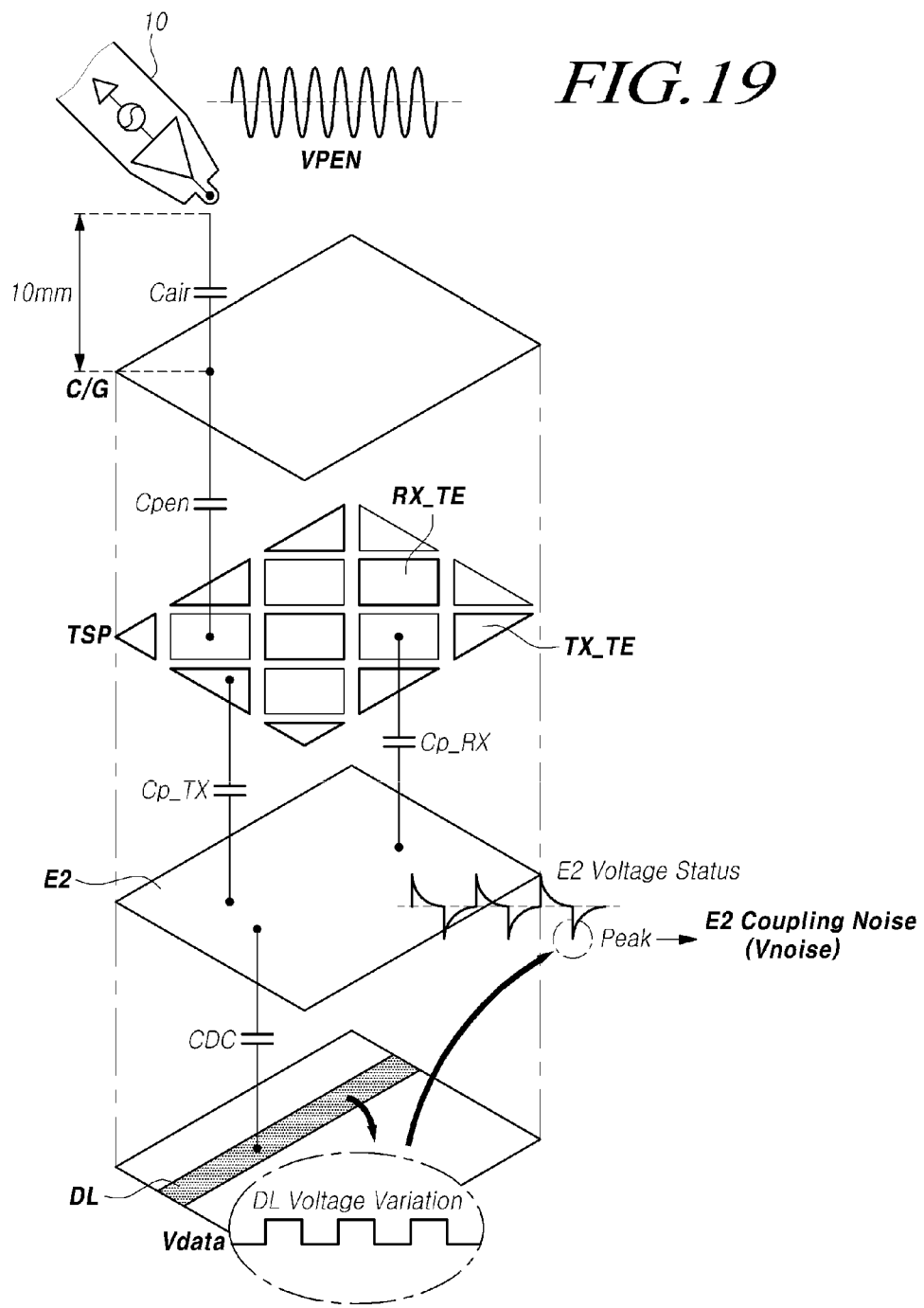
FIG. 19 is a diagram illustrating various capacitances generated in connection with the sensing operation in the touch display device according to the embodiments of the present invention.

FIG. 19 is a diagram illustrating various capacitances (Cair, Cpen, Cp_TX, Cp_RX, Cdc) generated in connection with the sensing operation in the touch display device according to the embodiments of the present invention.

In the display panel (DISP), the encapsulation layer (ENCAP) can be disposed on the light emitting element (ED) including the pixel electrode (E1), the light-emitting layer (EL) and the common electrode (E2). The first touch electrode (TX-TE) and the second touch electrode (RX-TE) forming the touch panel (TSP) can be located on the encapsulation layer (ENCAP). The plurality of data lines (DL), the plurality of gate lines (GL) and the driving transistor (T1) can be located under the encapsulation layer (ENCAP).

Referring to FIG. 19, the common electrode (E2) can be disposed on the data line (DL), and the first touch electrode (TX-TE) and the second touch electrode (RX-TE) can be disposed on the common electrode (E2), and the cover glass (C/G) can be placed on the first touch electrode (TX-TE) and the second touch electrode (RX-TE).

In this stack structure, when the pen tip of the pen 10 contacts to the cover class (C/G) to generate the pen touch, a pen capacitance (Cpen) can be formed between the pen 10 and the second touch electrode (RX-TE).

In the case that a hover type pen touch occurs in which the pen tip of the pen 10 is separated from the cover class (C/G) by a predetermined distance (eg, about 10 mm) without contacting the cover class (C/G), an air capacitance (Cair) and a pen capacitance (Cpen) can be formed between the pen 10 and the second touch electrode (RX-TE). That is, the air capacitance (Cair) can be formed between the pen 10 and the cover class (C/G), and the pen capacitance (Cpen) can be formed between the cover class (C/G) and the second touch electrode (RX-TE).

As described above, the parasitic capacitance (Cp_TX) can be formed between the first touch electrode (TX-TE) and the common electrode (E2), and the parasitic capacitance (Cp_RX) can be formed between the second touch electrode (RX-TE) and the common electrode (E2).

The parasitic capacitance (CDC) can be formed between the data line (DL) for applying the data voltage (Vdata) and the common electrode (E2) for applying the common voltage (VSS).

Referring to FIG. 19, the data voltage (Vdata) can be a video signal or an image signal whose voltage level varies for image display. The voltage of the data line (DL) can change as the data voltage (Vdata) is applied.

The voltage state at the common electrode (E2) coupled to the data line (DL) through the parasitic capacitance (CDC) can be changed in accordance with the voltage variation in the data line (DL).

More specifically, at the timing when the voltage level of the data voltage (Vdata) changes, the common electrode (E2) coupled to the data line (DL) through the parasitic capacitance (CDC) can generate a voltage level in accordance with the voltage level of the data voltage Vdata It is possible to generate a peak voltage according to the voltage level change of the data voltage (Vdata).

That is, in the common electrode (E2), the common voltage (VSS) in the form of the applied DC voltage is not constantly maintained, but the peak voltage can be generated due to the voltage variation of the data line (DL).

As described above, an undesired voltage state change can be generated in the common electrode (E2) coupled to the data line (DL) through the parasitic capacitance (Cdc) due to the voltage variation in the data line DL. This can act as a noise that undesirably affects the touch sensing (pen sensing, touch sensing) as well as the display. That is, the peak voltage generated at the common electrode (E2) can correspond to the noise voltage (Vnoise) which can degrade display performance and touch performance.

Figure 20:
FIG. 20 is another diagram illustrating the main signals used for the touch display device according to the embodiments of the present invention.
Figure 20:
Figure 20:
Figure 20:
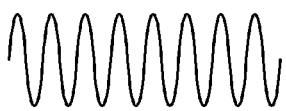

FIG. 20 is another diagram illustrating the main signals (VREF, VTX, VPEN, VSS) used for the touch display device according to the embodiments of the present invention.

Referring to FIG. 20, as described with regard to FIG. 18, the pen signal (VPEN) output from the pen 10 can be a signal whose voltage is variable (sinusoidal wave, rectangular wave, etc.). The reference voltage (VREF) applied to the first input terminal (Ni1) of the operational amplifier (OP-AMP) and the driving signal (VTX) applied to the first touch electrode (TX-TE) can be DC voltage signals.

Referring to FIG. 20, the common voltage (VSS) applied to the common electrode (E2) can be a DC voltage or, in some cases, a signal whose voltage level varies.

Figure 21:
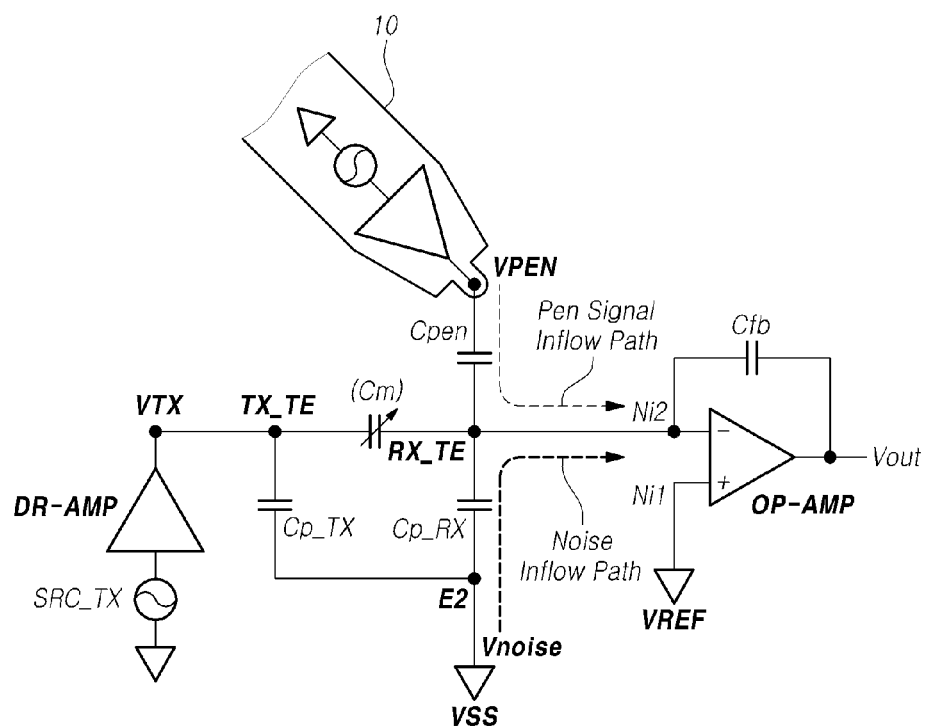
FIG. 21 is a view illustrating a phenomenon in which the noise voltage is introduced through the common electrode in the touch display device according to embodiments of the present invention.
Figure 22:
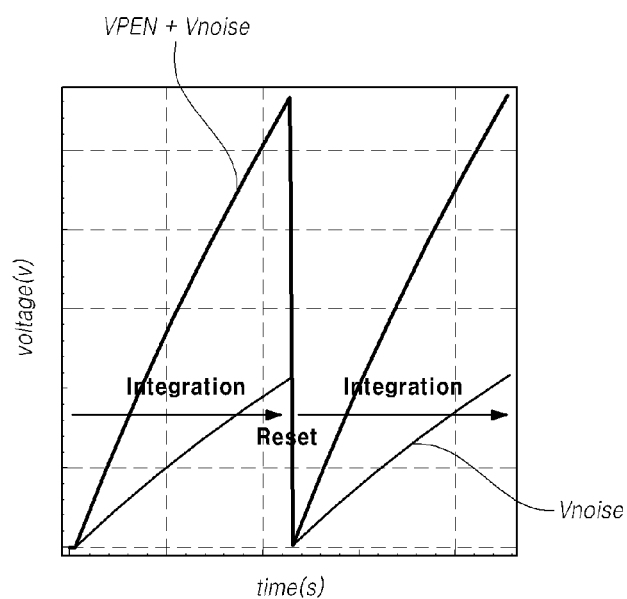
FIG. 22 is a graph illustrating a phenomenon in which the touch sensitivity is reduced due to the noise voltage introduced into the common electrode in the touch display device according to embodiments of the present invention.

FIG. 21 is a view illustrating a phenomenon in which the noise voltage is introduced through the common electrode in the touch display device according to embodiments of the present invention, and FIG. 22 is a graph illustrating a phenomenon in which the touch sensitivity is reduced due to the noise voltage introduced into the common electrode in the touch display device according to embodiments of the present invention.

Referring to FIG. 21, the pen signal (VPEN) output to the pen 10 can be applied to the second touch electrode (RX-TE). The pen signal (VPEN) applied to the second touch electrode (RX-TE) can be input to the second input terminal (Ni2) of the operational amplifier (OP-AMP) connected to the second touch electrode (RX-TE).

The feedback capacitor (Cfb) can be charged by the pen signal (VPNE) input to the second input terminal (Ni2) of the operational amplifier (OP-AMP) and accordingly the output voltage (Vout) can be output to the output terminal (No) of the operational amplifier (OP-AMP).

The output voltage (Vout) is input to the integrator (INTG). The integral value output from the integrator (INTG) is input to the analog-to-digital converter (ADC). The analog-to-digital converter (ADC) converts the integral value into a sensing value corresponding to the digital value. The touch controller (TCTR) can perform pen sensing on the basis of the sensing value. As a result, the presence, position, tilt, pressure, and various kinds of additional information regarding to the pen 10 can be detected.

Referring to FIG. 21, the noise can be generated in the common electrode (E2) coupled with the data line (DL) through the parasitic capacitance (CDC) due to the voltage variation in the data line (DL), and the noise voltage (Vnoise) corresponding to the generated noise can be introduced into the second touch electrode (RX-TE) coupled to the common electrode (E2) through the parasitic capacitance (Cp_RX).

The noise voltage (Vnoise) flowing into the second touch electrode (RX-TE) can also flow into the touch circuit (TC) electrically connected to the second touch electrode (RX-TE). That is, the noise voltage (Vnoise) applied to the second touch electrode (RX-TE) can flow into the second input terminal (Ni2) of the operational amplifier (OP-AMP) electrically connected to the second touch electrode (RX-TE).

Accordingly, the signal obtained by combining the pen signal (VPEN) applied to the second touch electrode (RX-TE) and the noise voltage (Vnoise) applied to the second touch electrode (RX-TE) can be input to the second input terminal (Ni2) of the operational amplifier (OP-AMP).

Accordingly, as shown in FIG. 22, the integral value according to the integration result of the integrator (INTG) can correspond to the integral value of the signal obtained by adding the noise voltage (Vnoise) to the pen signal (VPEN). As a result, pen sensing performance can be weakened.

Although FIGS. 21 and 22 are described based on the pen sensing, the similar phenomenon can occur at the finger sensing.

During the finger sensing, the signal generated in the the second touch electrode (RX-TE) due to the mutual capacitance (Cm) between the first touch electrode (TX-TE) and the second touch electrode (RX-TE), which varies depending on the presence or absence of the finger touch, can be input to the second input terminal (Ni2) of the operational amplifier (OP-AMP).

In addition, the noise voltage (Vnoise) which is generated at the common electrode (E2) and is introduced into the second touch electrode (RX-TE) coupled to the common electrode E2 can also flow into the second input terminal (Ni2) of the operational amplifier (OP-AMP). That is, the signal corresponding to the mutual capacitance (Cm) and necessary for finger sensing as well as the noise voltage (Vnoise) flowing from the common electrode (E2) to the second touch electrode (RX-TE) can be input to the second input terminal (Ni2) of the operational amplifier (OP-AMP). Therefore, the finger sensing performance can be weakened.

Figure 23:
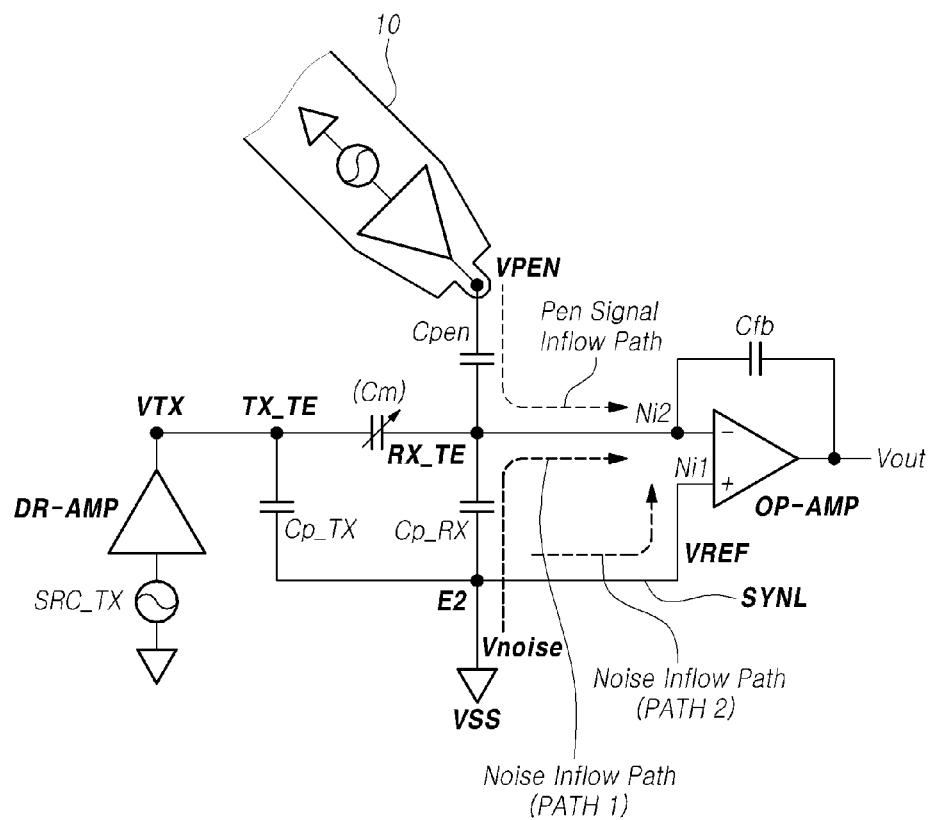
FIGS. 23 and 24 are diagrams illustrating the circuit to which the technique for reducing the influence of noise introduced through the common electrode is applied in the touch display device according to the embodiments of the present invention.
Figure 24:
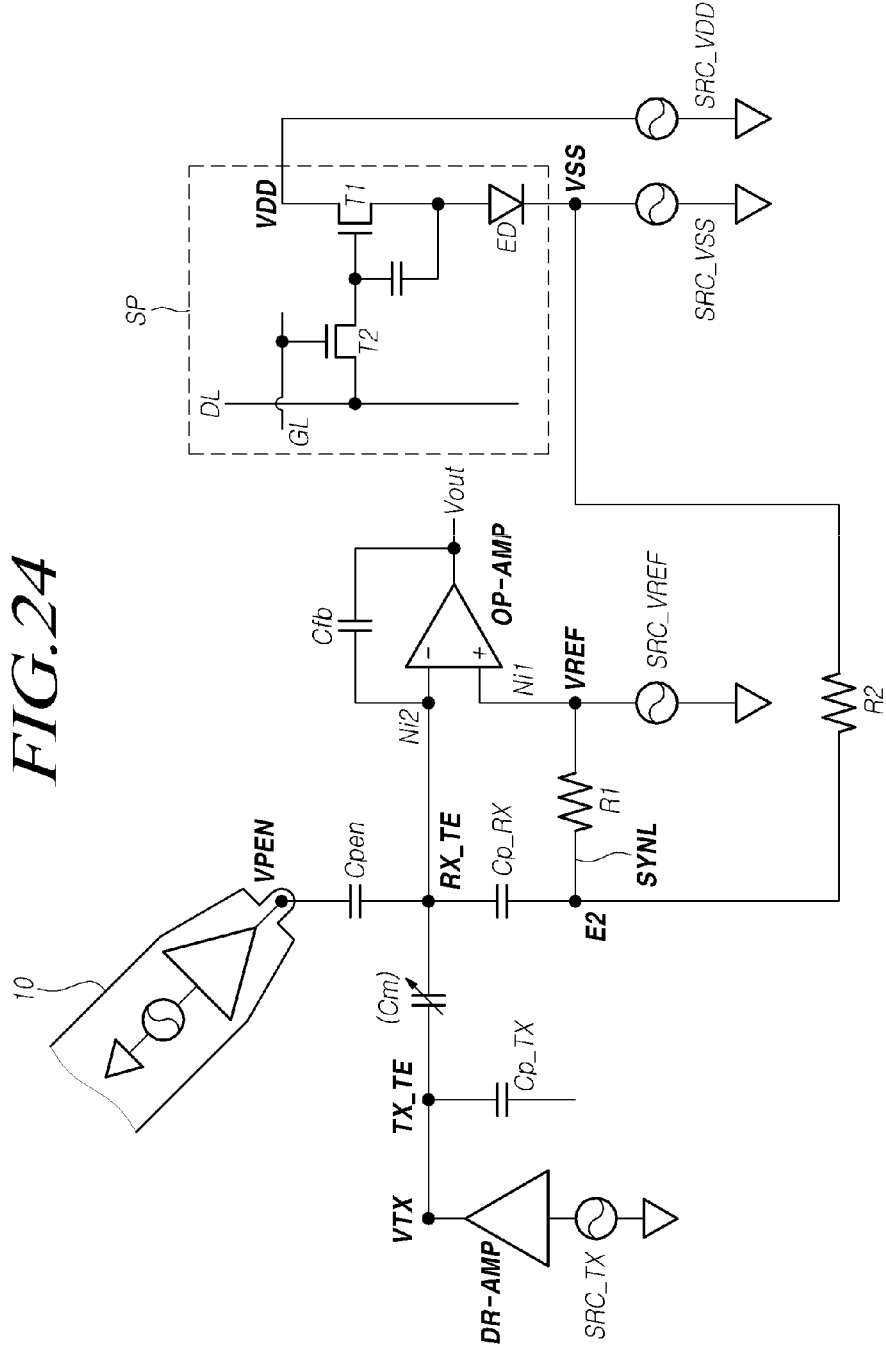

FIGS. 23 and 24 are diagrams illustrating the circuit to which the technique for reducing the influence of noise introduced through the common electrode is applied in the touch display device according to the embodiments of the present invention.

As described above with reference to FIG. 15, the touch circuit (TC) can include the operational amplifier (OP-AMP) electrically connected to the sensing target touch electrode (TE) among the plurality of touch electrodes (TE) disposed on the display panel (DISP), the integrator (INTG) electrically connected to the output terminal (No) of the operational amplifier (OP-AMP), and the analog-to-digital converter (ADC) converting the integral value output from the integrator (INTG) into a digital value.

Referring to FIG. 23, the operational amplifier (OP-AMP) can include the first input terminal (Ni1) to which the reference voltage (VREF) is input, the second input terminal (Ni2) connected to the sensing target touch electrode (TX-TE), and the output terminal (No) for outputting the output voltage (Vout).

Referring to FIG. 23, in the touch display device according to the embodiments of the present invention, the common voltage (VSS) applied to the common electrode (E2) and the reference voltage (VREF) input to the first input terminal (Ni1) of the operational amplifier (OP-AMP) can be synchronized with each other in order to reduce the influence of the noise voltage (Vnoise) flowing through the common electrode (E2).

Referring to FIG. 23, in the touch display device according to the embodiments of the present invention, the common electrode (E2) for applying the common voltage (VSS) and the first input terminal (Ni1) of the operational amplifier (OP-AMP) required to apply the reference voltage (VREF) can be electrically connected in order to reduce the influence of the noise voltage (Vnoise) flowing through the common electrode (E2).

For this purpose, the first input terminal (Ni1) of the operational amplifier (OP-AMP) can be directly connected to the common electrode (E2) or can be electrically connected to the common electrode (E2) through the synchronization line (SYNL). For example, noise that that is input to both first and second terminals is canceled due to opposite polarity of the first input terminal (Ni1) and the second input terminal (Ni2).

The synchronization line (SYNL) can be disposed in at least one of the printed circuit electrically connected to the display panel (DISP), the display panel (DISP), and a touch circuit (TC).

Referring to FIG. 24, the synchronization line (SYNL) can have a wiring resistance (R1). The wiring resistance (R1) can be a resistance component of the synchronization line (SYNL) or can be a resistive element that is intentionally designed and connected.

Referring to FIG. 24, the common voltage (VSS) is the voltage applied to the common electrode (E2) among the pixel electrode (E1), the light emitting layer (EL) and common electrode (E2) included in the light emitting element (ED) in each subpixel (SP) arranged in the display panel (DISP).

Similar to the synchronization line (SYNL) for electrically connecting the first input terminal (Ni1) of the operational amplifier (OP-AMP) and the common electrode (E2), the common electrode (E2) can also have a resistance component (R2).

Referring to FIG. 24, the touch display device according to embodiments of the present invention can include the common voltage source (SRC_VSS) for supplying the common voltage (VSS) to the common electrode (E2), and the reference voltage source (SRC_VREF) for supplying the reference voltage (VREF) to a first input terminal (Ni1) of the operational amplifier (OP-AMP).

For synchronization between the common voltage (VSS) and the reference voltage (VREF), the output terminal of the common voltage source (SRC_VSS) and the output terminal of the reference voltage source (SRC_VREF) can be connected by the synchronization line (SYNL).

Only one of the common voltage source (SRC_VSS) and the reference voltage source (SRC_VREF) can be used. For example, without using the reference voltage source (SRC_VREF), only the common voltage source (SRC_VSS) can be used to supply the reference voltage (VREF) and the common voltage (VSS). Alternatively, the reference voltage (VREF) and the common voltage (VSS) can be supplied by using only the reference voltage source (SRC_VREF) without the common voltage source (SRC_VSS).

That is, the touch display device according to embodiments of the present invention can include the voltage source commonly connected to the common electrode (E2) and the first input terminal (Ni1) of the operational amplifier (OP-AMP).

Referring to FIG. 24, the touch display device according to embodiments of the present invention can include the pixel driving voltage source (SRC_VDD) for supplying the driving voltage (VDD) applied to the drain node or the source node of the first transistor (T1) as the driving transistor.

Figure 25:
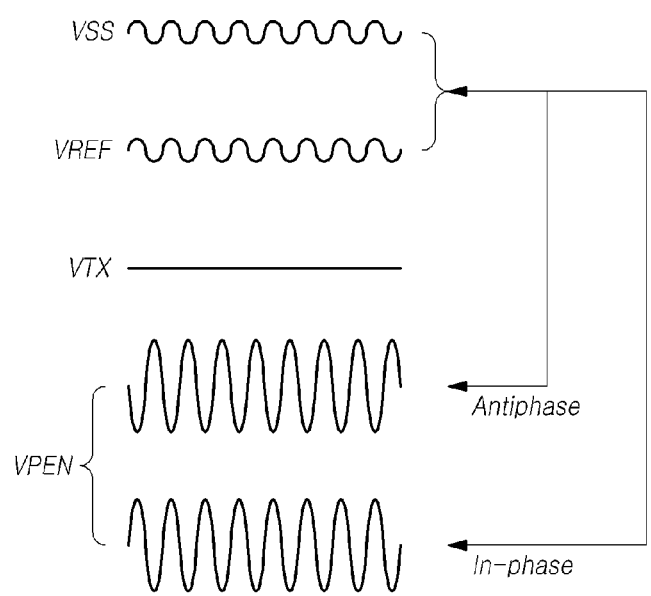
FIG. 25 is a diagram illustrating main signals in the case that the noise reduction technique is applied to the touch display device according to the embodiments of the present invention.
Figure 26:
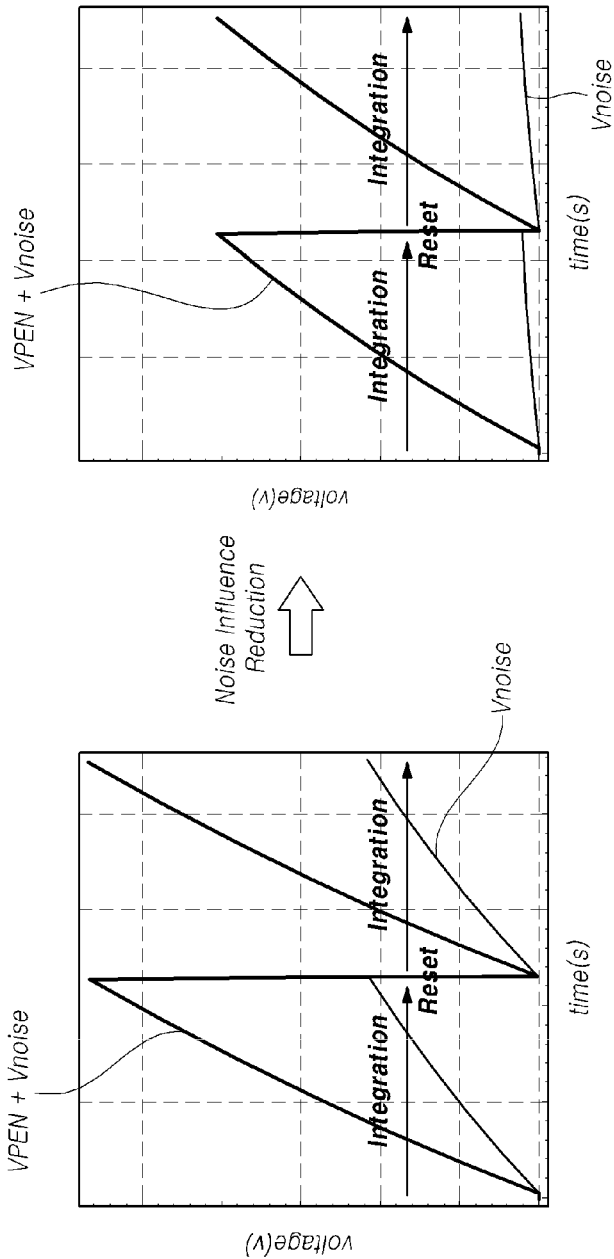
FIG. 26 is a diagram illustrating the noise reduction effect in the case that the noise reduction technique is applied to the touch display device according to the embodiments of the present invention.
Figure 27:
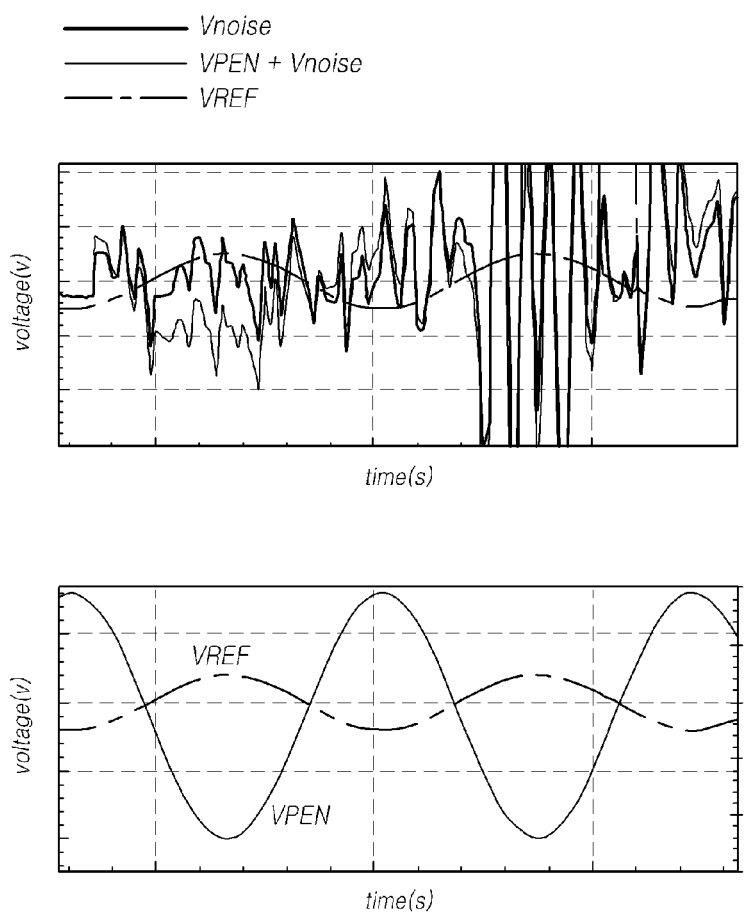
FIG. 27 is a graph of a simulation result for explaining the noise reduction effect in the case that the noise reduction technique is applied to the touch display device according to the embodiments of the present invention.

FIG. 25 is a diagram illustrating main signals in the case that the noise reduction technique is applied to the touch display device according to the embodiments of the present invention, and FIG. 26 is a diagram illustrating the noise reduction effect in the case that the noise reduction technique is applied to the touch display device according to the embodiments of the present invention, and FIG. 27 is a graph of a simulation result for explaining the noise reduction effect in the case that the noise reduction technique is applied to the touch display device according to the embodiments of the present invention.

Referring to FIG. 25, the common voltage (VSS) applied to the common electrode (E2) and the reference voltage (VREF) input to the first input terminal (Ni1) of the operational amplifier (OP-AMP) can be signals synchronized with each other.

The common voltage (VSS) and the reference voltage (VREF) can be modulation signals whose voltages are variable and can be DC voltages. For example, during the pen sensing mode period, the common voltage (VSS) and the reference voltage (VREF) can be modulation signals whose voltages are variable. During the finger sensing mode based on the mutual capacitance, the common voltage (VSS) and the reference voltage (VREF) can be DC voltages.

As shown in FIG. 25, the common voltage (VSS) and the reference voltage (VREF) can be modulation signal synchronized with each other by having the frequency and the phase corresponding to each other, in order to reduce the influence by noise. In embodiments, reference to synchronize can refer to having the same frequency and the same phase.

The amplitude of the common voltage (VSS) and the amplitude of the reference voltage (VREF) can be equal to each other. In some cases, the amplitude of the common voltage (VSS) and the amplitude of the reference voltage (VREF) can be different from each other by the resistors (R1, R2).

The pen signal (VPEN) can be a in-phase signal having the same phase as the common voltage (VSS) and the reference voltage (VREF). Alternatively, the pen signal (VPEN) can be a antiphase signal having a phase different from the common voltage (VSS) and the reference voltage (VREF). This pen signal (VPEN) can be the pen signal required to sense the position information and/or tilt information of the pen 10.

Referring to FIG. 23, according to the noise reduction technique described above, the noise voltage (Vnoise) can be applied not only to the second input terminal (Ni2) of the operational amplifier through the second touch electrode (RX-TE) coupled to the common electrode (E2) (PATH 1) but also to the first input terminal (Ni1) of the operational amplifier by the synchronization of the common voltage (VSS) and the reference voltage (VREF) (PATH 2). That is, the pen signal (VPEN) and the noise voltage (Vnoise) are inputted to the second input terminal (Ni2) of the operational amplifier (OP-AMP), and the reference voltage (VREF) and the noise voltage (Vnoise) are inputted to the first input terminal (Ni1) of the operational amplifier (OP-AMP).

Therefore, the noise voltage (Vnoise) can be eliminated or reduced at the voltage difference between the first input terminal (Ni1) and the second input terminal (Ni2) of the operational amplifier (OP-AMP). Therefore, the output voltage (Vout) of the operational amplifier (OP-AMP), which is determined by the voltage difference between the first input terminal (Ni1) and the second input terminal (Ni2), can be the voltage with the removed or reduced noise voltage (Vnoise).

Therefore, as shown in FIG. 26, the integral value output from the integrator (INTG) can be a integral value obtained by subtracting or eliminating the component corresponding to the noise voltage (Vnoise), and absolutely determined by the pen signal (VPEN). Accordingly, the influence due to the noise voltage (Vnoise) can be reduced or eliminated, and the touch sensing performance can be greatly improved.

Referring to the simulation result of FIG. 27, the voltage level of the noise voltage (Vnoise) can become similar to the reference voltage (VREF). That is, since the noise voltage (Vnoise) is converged in phase with the sinusoidal wave of the reference voltage (VREF), the voltage level of the noise voltage (Vnoise) can gradually become close to zero.

The signal (VPEN+Vnoise) input to the second input terminal (Ni2) of the operational amplifier (OP-AMP) can be amplified gradually by being shifted away from the sinusoidal wave of the reference voltage (VREF) in the opposite phase. Accordingly, in the case that the noise reduction technique is used, the signal to noise ratio (SNR) can be increased. In addition, it can eliminate the influence of noise on the display image quality.

Figure 28:
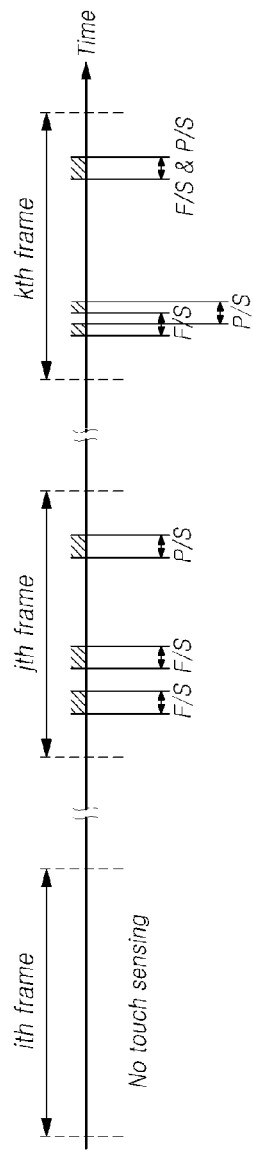
FIG. 28 is a diagram illustrating various timings of finger sensing operation and pen sensing operation in the touch display device according to the embodiments of the present invention.

FIG. 28 is a diagram illustrating various timings of finger sensing operation (F/S) and pen sensing operation (P/S) in the touch display device according to the embodiments of the present invention.

The touch display device according to embodiments of the present invention can perform finger sensing (F/S) and pen sensing (P/S) at various timings.

For example, as in the i-th frame, only the display driving for display can performed without the finger sensing (F/S) and the pen sensing (P/S) for one frame.

Also, as in the j-th frame, during one frame, the finger sensing (F/S) can be performed only during a certain time interval required within one frame time. Furthermore, during one frame, the pen sensing (P/S) can be performed only during a certain time period required within one frame time. Also, during one frame, the finger sensing (F/S) and the pen sensing (P/S) can be performed in some non-overlapping time intervals within one frame time.

As in the k-th frame, the finger sensing (F/S) and the pen sensing (P/S) can be performed during the overlapped time period during one frame. In this case, the sensing result of each of the finger sensing (F/S) and the pen sensing (P/S) can be distinguished by the touch controller (TCTR) or the like through signal analysis according to a predetermined algorithm or sensing position.

In addition to these examples, the display and the touch sensing (finger sensing and/or pen sensing) can be performed separately in time, or can be performed at various timings independently.

Figure 29:
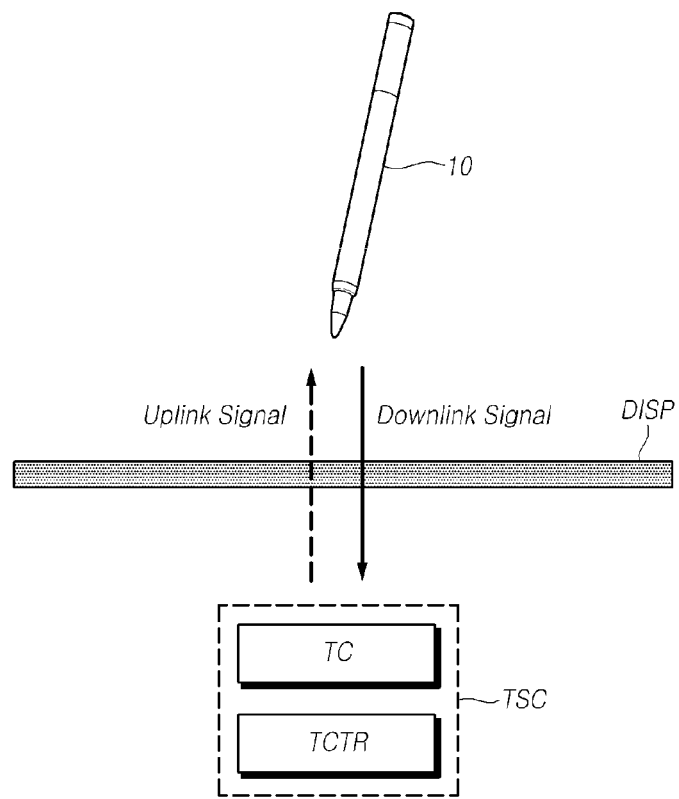
FIGS. 29 and 30 are diagrams illustrating bidirectional communication between the pen and the touch circuit for sensing the pen touch in the touch display device according to the embodiments of the present invention.
Figure 30:
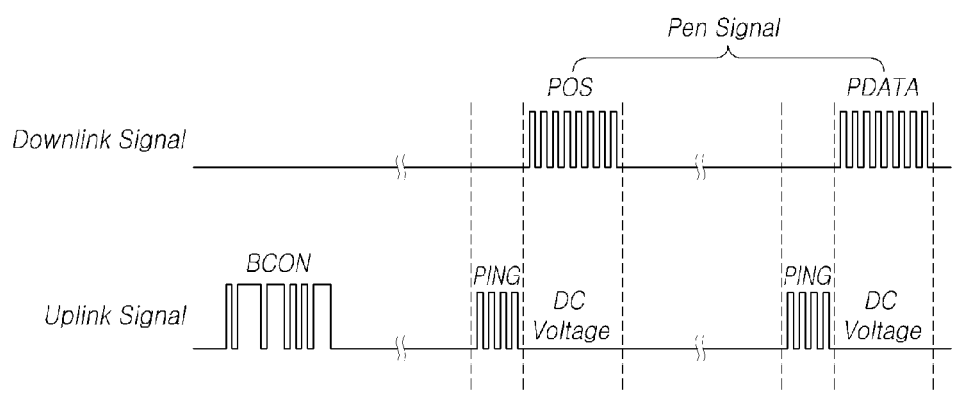

FIGS. 29 and 30 are diagrams illustrating bidirectional communication between the pen and the touch circuit for sensing the pen touch in the touch display device according to the embodiments of the present invention.

Referring to FIG. 29, the touch system according to embodiments of the present invention can include the touch display device including the display panel (DISP) and the touch sensing circuit (TSC), and one or more pens 10 operable in conjunction with touch display device.

The touch sensing circuit (TSC) can include the touch circuit (TC) electrically connected to the plurality of touch electrodes (TE) disposed on the display panel (DISP), and the touch controller (TCTR) for controlling the operation of the touch circuit (TC) or for calculating the presence or coordinate of the finger touch or recognizing presence/absence, coordinates, tilt, pressure, or various information the of the pen touch.

The touch system according to embodiments of the present invention can provide bidirectional communication between the touch circuit (TC) and the pen 10 in order to sense the pen 10 in contact with or adjacent to the display panel (DISP).

The display panel (DISP) can be a transmission medium for bidirectional communication between the touch circuit (TC) and the pen 10. That is, the touch electrode (TE) disposed on the display panel (DISP) can serve as the transmission medium for bidirectional communication between the touch circuit (TC) and the pen 10.

Two-way communication or bidirectional communication between the touch circuit (TC) and the pen 10 can be performed by an uplink communication in which the touch circuit (TC) transmits the signal to the pen 10 through the display panel (DISP), and a downlink communication in which the pen 10 transmits the signal to the touch circuit (TC) through the display panel (DISP).

The signal transmitted from the touch circuit (TC) to the pen 10 through the display panel (DISP) can be also referred to as the uplink signal. The signal transmitted from the pen 10 to the touch circuit (TC) through the display panel (DISP) can be also referred to as the downlink signal.

In touch driving for pen sensing, the touch circuit (TC) can supply the uplink signals to all or part of the plurality of touch electrodes (TE) disposed on the display panel (DISP).

Accordingly, the pen 10 in contact with or adjacent to the display panel (DISP) can receive the uplink signal applied to one or more touch electrodes (TE) included in the display panel (DISP) through the pen tip of the pen 10.

The pen 10 can, in response to the uplink signal, output or radiate the downlink signal (hereinafter also referred to as the pen signal) which allows the touch circuit (TC) to sense the position of the pen 10, the tilt (or inclination) of the pen 10 or various additional information of the pen 10.

The downlink signal output from the pen 10 can be applied to one or more touch electrodes (TE) disposed on the display panel (DISP).

The touch circuit (TC) can receive the downlink signal output from the pen 10 and applied to one or more touch electrodes (TE). The touch controller (TCTR) can recognize the presence or absence of the pen 10 based on the downlink signal received by the touch circuit (TC) and can recognize the position, tilt, various pen additional information of the pen 10.

The touch circuit (TC) can include a multiplexer circuit, a plurality of analog front ends (AFEs), and an analog-to-digital converter (ADC). Each analog front end (AFE) can include the operational amplifier (OP-AMP) electrically connected to the touch electrode (TE) and the integrator (INTG) which integrates the output value of the operational amplifier (OP-AMP) and outputs the integral value.

In some cases, the touch circuit (TC) can include a touch power circuit for supplying or generating various voltages and signals.

Referring to FIG. 30, for example, the uplink signal can include a beacon signal (BCON). The beacon signal (BCON) can be a signal for controlling the driving of the pen 10 or informing the pen 10 of various information necessary for pen sensing. Information included in the beacon signal (BCON) can be information for pen sensing. For convenience of explanation, information included in the beacon signal (BCON) is also referred to as a pen driving control information.

For example, the pen driving control information included in the beacon signal (BCON) can include at least one of panel information (for example, panel status information, panel identification information, panel type information such as an in-cell type and the like), panel driving mode information (E.g., mode identification information such as a pen search mode and a pen mode), characteristic information of the downlink signal (e.g., frequency, number of pulses, etc.), driving timing related information for pen sensing, multiplexer driving information, power mode information (e.g., driving timing information that is not driven by a panel and a pen to reduce power consumption, etc.) and the like. The pen driving control information can further include information for driving synchronization between the display panel (DISP) and the pen 10.

For example, since the beacon signal (BCON) is a signal having an information transfer function, the pen driving control information can be a pulse modulation signal represented by a plurality of pulses. In this case, the pulse widths of the plurality of pulses included in the beacon signal (BCON) need not be constant.

Referring to FIG. 30, the uplink signal can further include a ping signal (PING). The ping signal (PING) can be a control signal for synchronization of the downlink signal.

For example, the pen can output the downlink signal at a time point when the last pulse of the ping signal (PING) is recognized or after a predetermined period of time has elapsed therefrom.

The ping signal (PING) can be one pulse signal or can include two or more pulses. In the case that the ping signal (PING) includes two or more pulses, the ping signal (PING) can be a pulse modulation signal having a constant pulse width since the ping signal (PING) is a signal having a synchronization function and not an information transfer function. That is, the ping signal (PING) can be a signal that swings regularly between a high level and a low level.

The synchronization function of the ping signal (PING) can also be provided by the beacon signal (BCON).

Referring to FIG. 30, after receiving the uplink signals (BCON, PING), the pen 10 can output the pen signal corresponding to the downlink signal in response to the uplink signal.

The pen signal corresponding to the downlink signal can include the pen position sensing signal (POS) for allowing the touch circuit (TC) to sense the position and/or tilt of the pen, and the pen data signal (PDATA) for allowing the touch panel (TC) to sense the pressure of the pen and various pen additional information.

Here, the pen additional information can include, for example, at least one of a pressure information, pen ID, button information, battery information, information for error check and correction, and the like.

During a period in which the pen 10 outputs a pen signal such as the pen position sensing signal (POS) and the pen data signal (PDATA), the touch circuit (TC) can supply the DC voltage to the touch electrode (TE).

In FIG. 30, the uplink signal and the downlink signal are illustrated as rectangular waves, but this is only an example, and a sine wave can also be used.

Figure 31:
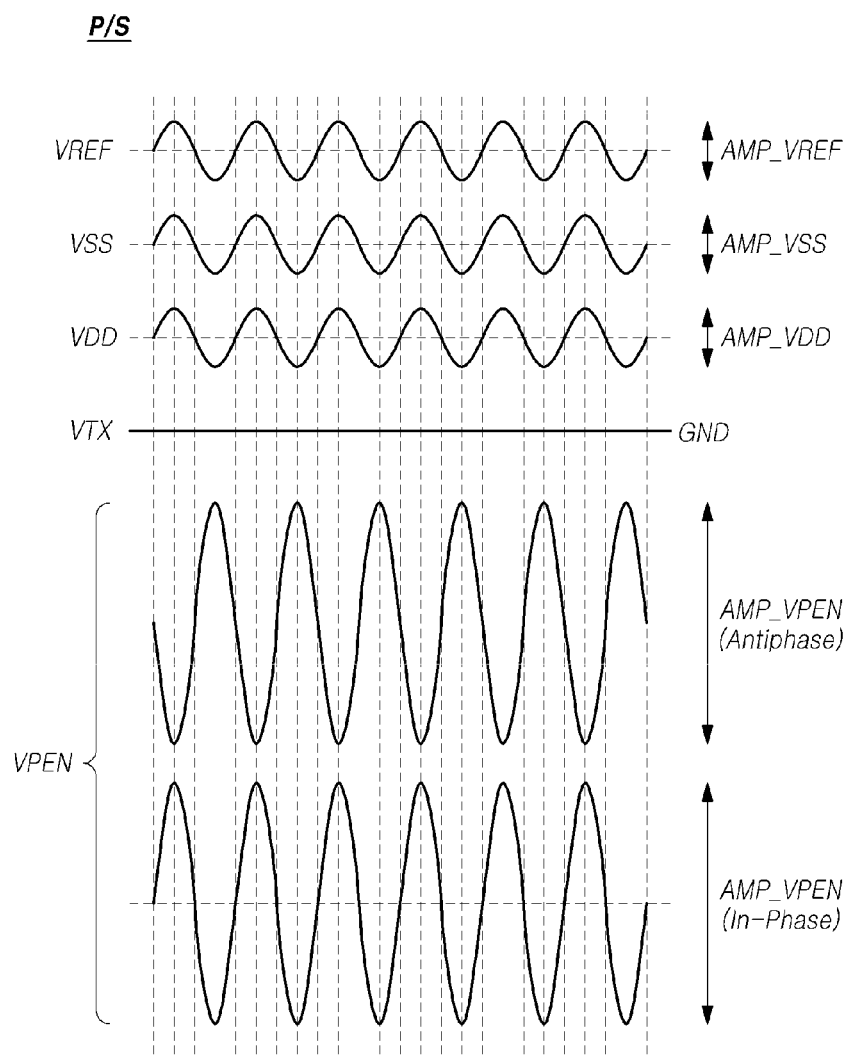
FIG. 31 is a diagram illustrating main signals in the pen sensing mode in the case that the noise reduction method is applied to the touch display device according to embodiments of the present invention.

FIG. 31 is a diagram illustrating main signals (VREF, VSS, VDD, VTX) in the pen sensing mode in the case that the noise reduction method is applied to the touch display device according to embodiments of the present invention.

Referring to FIG. 31, in the case that the operation mode of the touch display device is the pen sensing mode, the touch circuit (TC) the can detect the pen signal (VPEN) as the downlink signal outputted to the pen 10 through the second touch electrode (RX-TE) corresponding to the sensing target touch electrode.

In the case that the operation mode of the touch display device is the pen sensing mode, the common voltage (VSS) applied to the common electrode (E2) and the reference voltage (VREF) input to the first input terminal (Ni1) of the operational amplifier (OP-AMP) can be synchronized in the form of an AC signal (modulation signal).

The reference voltage (VREF) and the common voltage (VSS) can be modulation signals having corresponding phases and corresponding frequencies. The reference voltage (VREF) and the common voltage (VSS) can have various signal waveforms such as a rectangular wave, a sinusoidal wave, a triangular wave, and the like.

The reference voltage (VREF) can be a modulation signal swinging at a predetermined center voltage with a predetermined amplitude (AMP_VREF). The common voltage (VSS) can be a modulation signal swinging with a predetermined amplitude (AMP_VSS) at a predetermined center voltage.

For example, the center voltage of the reference voltage (VREF) and the center voltage of the common voltage (VSS) can be the same voltage of equal to or less than 0[V]. The amplitude (AMP_VREF) of the reference voltage (VREF) and the amplitude (AMP_VSS) of the common voltage (VSS) can correspond to or slightly differ from each other, and can be approximately several hundreds of mV.

The driving voltage (VDD) applied to the driving transistor (T1) can be a modulation signal swinging at a predetermined center voltage with a predetermined amplitude (AMP_VDD). The driving voltage (VDD) can have various signal waveforms such as a rectangular wave, a sinusoidal wave and a triangular wave.

The driving voltage (VDD) can be the modulation signal having a frequency and a phase corresponding to the reference voltage (VREF) and the common voltage (VSS).

For example, the driving voltage (VDD) can be the modulation signal swinging at the center voltage of 8V or more with the amplitude corresponding to the amplitude (AMP_VREF) of the reference voltage (VREF) or the amplitude (AMP_VSS) of the common voltage (VSS).

The pen signal (VPEN) for sensing the position and/or tilt of the pen 10 can have the same frequency as the reference voltage (VREF) and the common voltage (VSS).

The pen signal (VPEN) can have same phase with the reference voltage (VREF) and the common voltage (VSS). That is, the pen signal (VPEN) can be in-phase relationship with the reference voltage VREF and the common voltage VSS.

Alternatively, the pen signal VPEN can be out of phase with the reference voltage VREF and the common voltage VSS. That is, the pen signal (VPEN) can be in an antiphase or inverse relationship with the reference voltage (VREF) and the common voltage (VSS).

The amplitude (AMP_VPEN) of the pen signal (VPEN) can correspond to the amplitudes (AMP_VREF, AMP_VSS, AMP_VDD) of the reference voltage (VREF), the common voltage (VSS) and the driving voltage (VDD).

Alternatively, the amplitude (AMP_VPEN) of the pen signal (VPEN) can be greater than the amplitudes (AMP_VREF, AMP_VSS, AMP_VDD) of the reference voltage (VREF), the common voltage (VSS) and the driving voltage (VDD). As a result, the pen sensing performance can be improved.

For example, the amplitude (AMP_VPEN) of the pen signal (VPEN) can be 10 to 20 [V].

Referring to FIG. 31, in the case that the operation mode of the touch display device is the pen sensing mode, the pen signal (VPEN) of the modulation signal type is applied to the second touch electrode (RX-TE) corresponding to the sensing target touch electrode, but the first touch electrode (TX-TE) can be floated, or the DC voltage or a ground voltage (GND, 0 [V] or a voltage in the vicinity thereof) can be applied to the first touch electrode (TX-TE).

In this disclosure, the modulation signal can be a signal whose voltage level changes, and can have a specific frequency, a specific period, an specific amplitude, or a specific phase, and can be various forms such as a rectangular wave, a sine wave, or a triangle wave. Such a modulation signal can be referred to as the pulse signal or the AC signal.

In this disclosure, the amplitude of the modulation signal can mean a voltage difference between a high level voltage and a low level voltage of the modulation signal.

The frequency of the modulation signal can be constant or variable.

Figure 32:
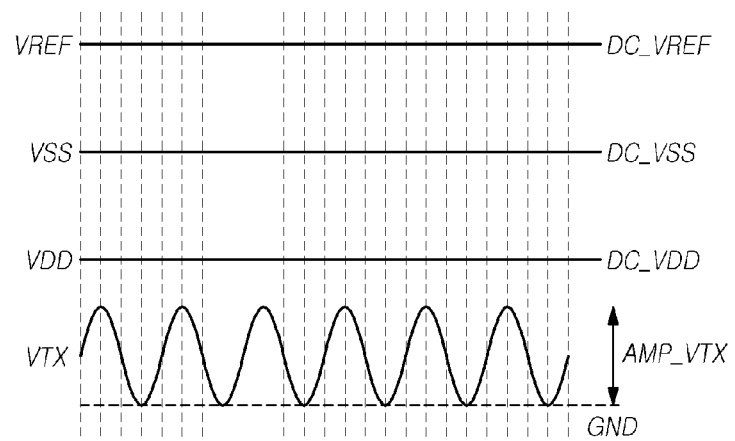
FIG. 32 is a diagram illustrating main signals in the finger sensing mode based on the mutual capacitance in the case that the noise reduction method is applied to a touch display device according to embodiments of the present invention.

FIG. 32 is a diagram illustrating main signals in the finger sensing mode based on the mutual capacitance in the case that the noise reduction method is applied to a touch display device according to embodiments of the present invention.

In the case that the operation mode of the touch display device is the finger sensing mode based on the mutual capacitance, the plurality of touch electrodes (TE) can be classified into the first touch electrodes (TX-TE) for applying the driving signal (VTX) and the second touch electrodes (RX-TE) for detecting the sensing signal.

In the case that the operation mode of the touch display device is the finger sensing mode based on the mutual capacitance, the touch circuit (TC) can detect the sensing signal corresponding to the change of the mutual capacitance (Cm) formed between the first touch electrode (TX-TE) and the second touch electrode (RX-TE) through the second touch electrode (RX-TE).

In the case that the operation mode of the touch display device is the finger sensing mode based on the mutual capacitance, the common voltage (VSS) applied to the common electrode (E2) and the reference voltage (VREF) input to the first input terminal (Ni1) of the operational amplifier (OP-AMP) can be synchronized to the DC voltage.

That is, in the case that the operation mode of the touch display device is the finger sensing mode, the touch circuit TC can apply the driving signal (VTX) to one or more first touch electrodes (TX-TE) among the plurality of first touch electrodes (TX-TE), and can detect the sensing signal through the second input terminal (Ni2) of the operational amplifier (OP-AMP) electrically connected to the second touch electrode (RX-TE) corresponding to the sensing target touch electrode among the plurality of the second touch electrode (RX-TE).

In the case that the operation mode of the touch display device is the finger sensing mode, the reference voltage (VREF) and the common voltage (VSS) can be DC voltages.

For example, the constant voltage value (DC_VREF) corresponding to the reference voltage (VREF) and the constant voltage value (DC_VSS) corresponding to the common voltage VSS can be a voltage of about 0 [V] or less, and they can be the same or slightly different from each other.

For finger sensing based on the mutual capacitance (Cm), the driving signal (VTX) applied to the first touch electrode (TX-TE) can be the modulation signal having the predetermined amplitude (AMP_VTX).

The driving signal (VTX) can be the signal swinging with the predetermined amplitude (AMP_VTX) from the low level voltage of the ground voltage (GND) of 0 V or the like.

For example, the driving signal (VTX) can swing between approximately 2~8[V] and 0[V]. That is, the high level voltage of the driving signal (VTX) is approximately 2 to 8 V, the low level voltage of the driving signal (VTX) can be 0 V, and the amplitude (AMP_VDD) of the driving signal (VTX) is approximately 2~8 [V].

The driving voltage (VDD) applied to the driving transistor (T1) can be a DC voltage.

For example, the constant voltage value (DC_VDD) corresponding to the driving voltage (VDD) can be about 8 [V] or a voltage in the vicinity thereof.

Figure 33:
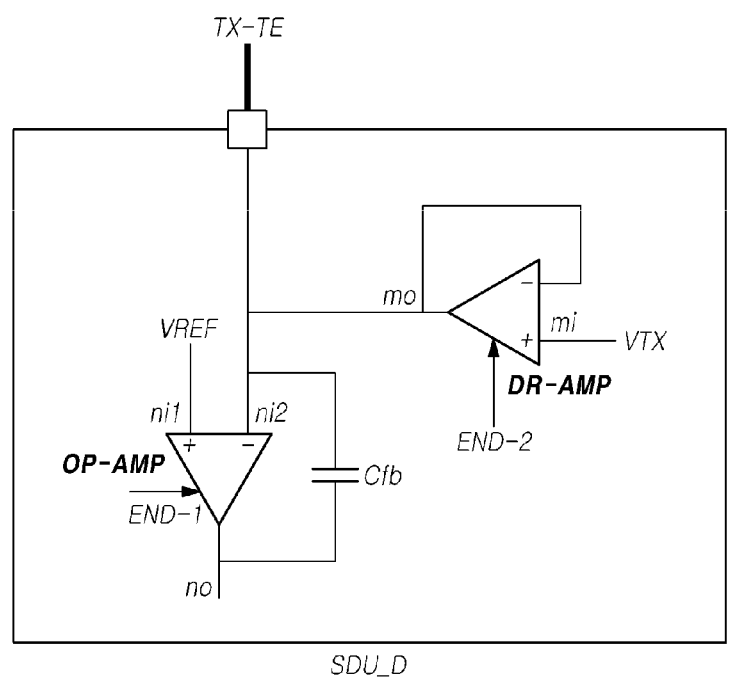
FIG. 33 is a view illustrating another example of the first sensing driving unit included in the first touch circuit in the touch circuit of the touch system according to the embodiments of the present invention.

FIG. 33 is a view illustrating another example of the first sensing driving unit (SDU_D) included in the first touch circuit (TC1) in the touch circuit (TC) of the touch system according to the embodiments of the present invention.

Figure 34:
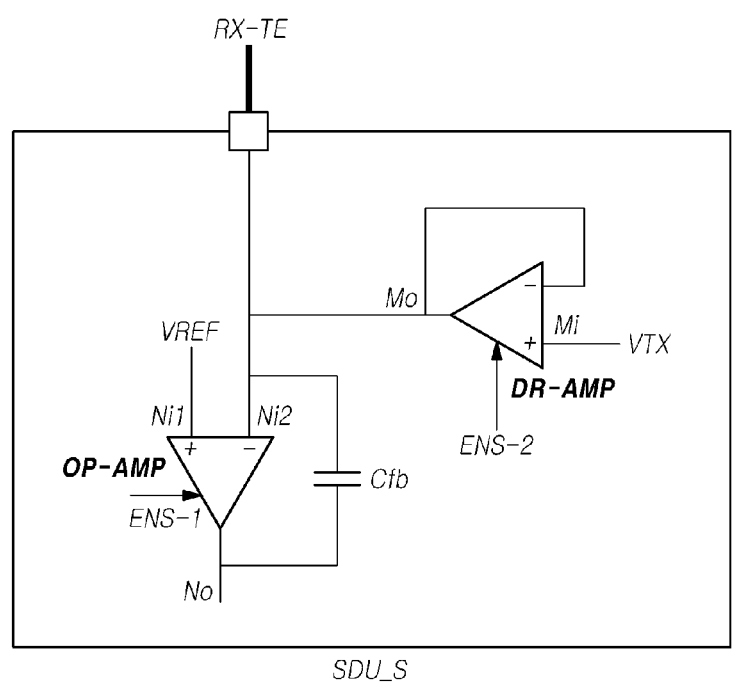
FIG. 34 is another example of the second sensing driving unit included in the second touch circuit in the touch circuit of the touch system according to embodiments of the present invention.

FIG. 34 is another example of the second sensing driving unit (SDU_S) included in the second touch circuit (TC2) in the touch circuit (TC) of the touch system according to embodiments of the present invention.

As shown in FIG. 13, the first touch circuit (TC1) can include first sensing driving units (SDU_D) electrically connected to the first touch electrodes (TX-TE). The second touch circuit (TC2) can include second sensing driving units (SDU_S) electrically connected to the second touch electrodes (RX-TE).

Referring to FIG. 33, each first sensing driving unit (SDU_D) in the first touch circuit (TC1) can include the driving amplifier (DR-AMP) for supplying the drive signal (VTX) in the form of a modulation signal (AC signal) to the first touch electrode (TX-TE) in order to perform the mutual-capacitance based finger sensing, or for supplying the driving signal (VTX) in the form of a DC signal to the first touch electrode (TX-TE) in order to perform the pen sensing.

In addition, each of the first sensing driving units (SDU_D) in the first touch circuit (TC1) can include the amplifier (OP-AMP) for performing the self-capacitance-based finger sensing (or pen sensing) as well as the driving amplifier (DR-AMP).

The driving amplifier (DR-AMP) can have a driving input terminal (mi) for receiving the driving signal (VTX) and a driving output terminal (mo) for amplifying and outputting the driving signal (VTX). Here, the driving signal (VTX) input to the driving input terminal (mi) can be the driving signal for finger sensing based on the mutual capacitance, or can be the driving signal in the form of the DC signal for performing pen sensing.

The operational amplifier (OP-AMP) can include the first input terminal (ni1) for receiving the reference voltage (VREF), the second input terminal (ni2) electrically connected to the driving output terminal (mo) of the corresponding driving amplifier (DR-AMP), and the output terminal (no) for outputting the output voltage.

A feedback capacitor (Cfb) can be electrically connected between the second input terminal (ni2) and the output terminal (no) of the operational amplifier (OP-AMP).

The reference voltage (VREF) input to the first input terminal (ni1) of the operational amplifier (OP-AMP) can be a DC voltage or an AC signal (a modulation signal such as a sinusoidal signal or a rectangular wave signal). The DC voltage can be a reference voltage for mutual capacitance sensing, and the AC signal (modulation signal) can be the driving signal for self-capacitance based finger sensing (or pen sensing).

The operational amplifier (OP-AMP) can be also used to detect the sensing signal at the first touch electrode (TX-TE) during the finger sensing based on the mutual capacitance.

Referring to FIG. 33, the operational amplifier (OP-AMP) included in the first sensing driving unit (SDU_D) can be activated by the first sensing activation signal (END-1). The operation of the driving amplifier (DR-AMP) included in the first sensing driving unit (SDU_D) can be activated by the first driving activation signal (END-2).

Referring to FIG. 34, each second sensing driving unit (SDU_S) in the second touch circuit (TC2) can include the operational amplifier (OP-AMP) for detecting the sensing signal at the second touch electrode (RX-TE) at the time of finger sensing based on mutual capacitance.

Referring to FIG. 34, each second sensing driving unit (SDU_S) in the second touch circuit (TC2) can further include the driving amplifier (DR-AMP) for supplying the driving signal (VTX) to the second touch electrode (RX-TE) in addition to the operational amplifier (OP-AMP).

The driving amplifier DR-AMP can include the driving input terminal (Mi) for receiving the driving signal (VTX), and the driving output terminal (Mo) for amplifying and outputting the driving signal (VTX). Here, the driving signal (VTX) inputted to the driving input terminal (Mi) can be the driving signal for mutual capacitance sensing.

The operational amplifier (OP-AMP) can include the first input terminal (Ni1) for receiving the reference voltage (VREF), the second input terminal (Ni2) electrically connected to the driving output terminal (Mo) of the corresponding driving amplifier (DR-AMP), and the output terminal (No) electrically connected to the corresponding analog-to-digital converter (ADC).

A feedback capacitor (Cfb) can be electrically connected between the second input terminal (Ni2) and the output terminal (No) of the operational amplifier (OP-AMP).

The reference voltage (VREF) inputted to the first input terminal (Ni1) of the operational amplifier (OP-AMP) can be a DC voltage or an AC signal (a modulation signal such as a sinusoidal signal or a rectangular wave signal). In the case that the reference voltage (VREF) is the DC voltage, the reference voltage (VREF) can be the reference voltage for mutual capacitance sensing. In the case that the reference voltage (VREF) is the AC signal (a modulation including a sinusoidal wave signal or a rectangular wave signal), the reference voltage (VREF) can be the driving signal for self-capacitance sensing.

Referring to FIG. 34, the operational amplifier (OP-AMP) included in the second sensing driving unit (SDU_S) can be activated by the second sensing activation signal (ENS-1). The operation of the driving amplifier (DR-AMP) included in the second sensing drive unit (SDU_S) can be activated by the second driving activation signal (ENS-2).

Figure 35:
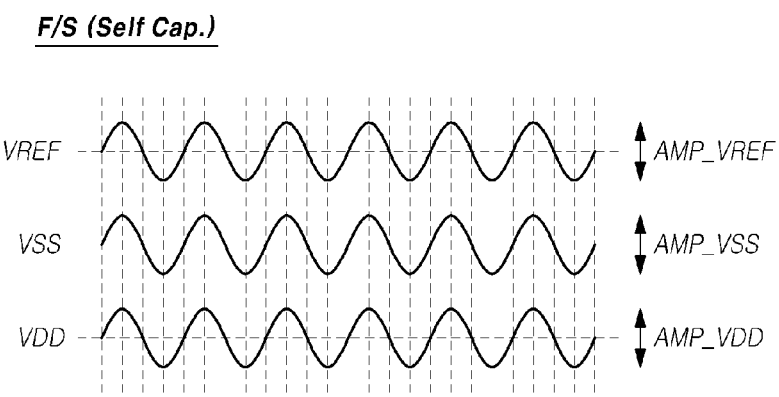
FIG. 35 is a diagram illustrating main signals in the finger sensing mode based on self-capacitance in the case that the noise reduction method is applied to the touch display device according to embodiments of the present invention.

FIG. 35 is a diagram illustrating main signals (VREF, VSS, VDD) in the finger sensing mode based on self-capacitance in the case that the noise reduction method is applied to the touch display device according to the embodiments of the present invention.

In the case that the operation mode of the touch display device is the self-capacitance-based finger sensing mode, in view of the arrangement, the plurality of touch electrodes (TE) can be classified into the first touch electrodes (TX-TE) and second touch electrodes (RX-TE) which intersect each other, and the first touch electrodes (TX-TE) and the second touch electrodes (RX-TE) can be functionally the same.

In the case that the operation mode of the touch display device is the self-capacitance-based finger sensing mode, the touch circuit (TC) can apply the driving signal (VTX) to the sensing target touch electrode (TE) among the plurality of touch electrodes (TE) and can detect the sensing signal through the second input terminal (Ni2) of the operational amplifier (OP-AMP) electrically connected to the sensing target touch electrode (TE) to which the driving signal (VTX) is applied.

In the case that the operation mode of the touch display device is the self-capacitance-based finger sensing mode, the reference voltage (VREF) and the common voltage (VSS) can be modulation signals having corresponding frequency in order to reduce the noise influence.

The driving voltage (VDD) applied to the driving transistor (T1) can be the modulation signal having the frequency corresponding to the reference voltage (VREF) and the common voltage (VSS).

For example, the frequencies of the reference voltage (VREF), the common voltage (VSS) and the driving voltage (VDD) can all be the same and the phases thereof can be the same. The amplitude (AMP_VREF) of the reference voltage (VREF), the amplitude (AMP_VSS) of the common voltage (VSS) and the amplitude (AMP_VDD) of the driving voltage (VDD) can also all be the same. The center voltage of each of the reference voltage (VREF) and the common voltage (VSS) can be the same. The center voltage of the driving voltage (VDD) can be higher than the center voltage of the reference voltage (VREF) and the common voltage (VSS).

Figure 36:
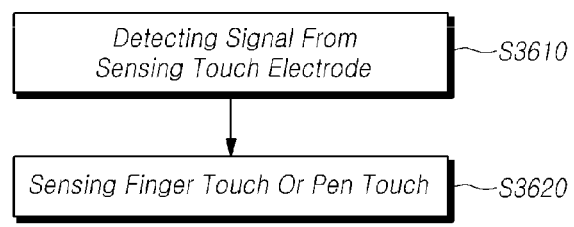
FIG. 36 is a flowchart of a method of driving a touch display device according to embodiments of the present invention.

FIG. 36 is a flowchart of a method of driving a touch display device according to embodiments of the present invention.

Referring to FIG. 36, the method of driving the touch display device according to the present invention can include the step S3610 in which the touch sensing circuit (TSC) detects the sensing signal from the sensing target touch electrode (RX-TE) among the plurality of touch electrodes (TE) arranged on the display panel (DISP), and the step S3620 in which the touch sensing circuit (TSC) senses the finger touch or the pen touch based on the sensed sensing signal.

Each of the plurality of subpixels (SP) disposed on the display panel (DISP) can include the light emitting element (ED) including the pixel electrode (E1), the light emitting layer (EL) and the common electrode (E2), and can include the driving transistor (T1) for driving the light emitting element (ED).

In step S3610, the touch sensing circuit (TSC) can receive the reference voltage (VREF) when the sensing signal is input from the sensing target touch electrode (RX-TE).

The reference voltage (VREF) can be synchronized with the common voltage (VSS) applied to the common electrode (E2).

The common voltage (VSS) applied to the common electrode (E2) and the reference voltage (VREF) inputted to the first input terminal (Ni1) of the operational amplifier (OP-AMP) can be modulation signals whose voltages are variable, and they can be synchronized by having the corresponding frequency and phase.

The common voltage (VSS) applied to the common electrode (E2) and the reference voltage (VREF) inputted to the first input terminal (Ni1) of the operational amplifier (OP-AMP) can be synchronized to the DC voltage.

The above embodiments of the present invention can reduce or eliminate mutual adverse effects between the display and the touch sensing, thereby can improve the display performance and the touch sensing performance.

The embodiments of the present invention can improve the accuracy of touch sensing by providing the high signal-to-noise ratio even when noise flows into the touch electrode (TE) or the touch circuit (TC).

The embodiments of the present invention can improve the pen sensing accuracy by allowing the high signal-to-noise ratio to be obtained at the time of pen sensing even when noise flows into the touch electrode (TE) or the touch circuit (TC).

According to the embodiments of the present invention, even if the noise voltage (Vnoise) is introduced into one input terminal (Ni2) of the touch circuit (TC) through the common electrode (E2) of the light emitting element (ED) in each subpixel used in the display driving, it is possible to eliminate or reduce the influence of the noise voltage input by the voltage control of the other input terminal (Ni1) of the touch circuit (TC), and thereby to improve the touch sensing performance.

According to the embodiments of the present invention, even if the noise voltage (Vnoise) is introduced into one input terminal (Ni2) of the touch circuit (TC) through the common electrode (E2) of the light emitting element (ED) in each subpixel used in the display driving, it is possible to eliminate or reduce the influence of the noise voltage input by electrically connecting the other input terminal (Ni1) of the touch circuit (TC) to the common electrode (E2), and thereby to improve the touch sensing performance.

According to the embodiments of the present invention, the common voltage (VSS) applied to the common electrode (E2) of the light emitting element (ED) in each subpixel used in the display driving and the reference voltage (VREF) of the touch circuit are synchronized with each other, so that it is possible to eliminate or reduce the influence of the noise voltage input and to improve the touch sensing performance.

According to the embodiments of the present invention, a touch display device includes: a display panel including a plurality of data lines, a plurality of gate lines, a plurality of touch electrodes, and a plurality of touch routing lines which are disposed on a substrate, wherein the display panel further includes an active area configured to display an image, and a non-active area which is outer to the active area; and a touch circuit configured to sense at least one of the plurality of touch electrodes, wherein the display panel further includes: a plurality of subpixels including a light emitting element including a pixel electrode, a light emitting layer, a common electrode, and a driving transistor to drive the light emitting element; and an encapsulation layer disposed on the common electrode, wherein the plurality of touch electrodes are disposed on the encapsulation layer, and the plurality of touch routing lines are disposed along an inclined surface of the encapsulation layer, and electrically connected to a plurality of touch pads disposed in the non-active area along an inclined surface of the encapsulation layer, wherein the touch circuit includes an operational amplifier having a first input terminal for inputting a reference voltage, a second input terminal connected to a sensing target touch electrode, and an output terminal for outputting an output voltage, and wherein a common voltage applied to the common electrode and the reference voltage inputted to the first input terminal of the operational amplifier are synchronized with each other.

According to the embodiments of the present invention, the plurality of data lines overlap the common electrode, and the plurality of touch electrodes overlap the common electrode.

According to the embodiments of the present invention, the display panel includes one or more dams disposed in the non-active area and disposed between the touch pad and the active area, wherein the one or more dams are formed higher than the touch pad.

According to the embodiments of the present invention, a touch routing line among the plurality of touch routing lines descends along an inclined surface of the encapsulation layer, crosses over the one of more dams, and is electrically connected to the touch pad.

According to the embodiments of the present invention, the common electrode is electrically insulated from the plurality of touch electrodes in the active area and is electrically connected to the touch circuit that is electrically connected to the plurality of touch electrodes.

According to the embodiments of the present invention, a polarity of the first input terminal and a polarity of the second input terminal of the operational amplifier are opposite.

According to the embodiments of the present invention, each of the plurality of touch electrodes is a mesh type including an open area, and the open area positionally corresponds to a light emitting region of the subpixel, According to the embodiments of the present invention, at least two touch electrodes of the plurality of touch electrodes are connected by a connection line formed on a different level layer from the at least two touch electrodes.

According to the embodiments of the present invention, the routing line includes multiple layers including a first layer and a second layer.

According to the embodiments of the present invention, the first layer is a same level layer with the connection line.

According to the embodiments of the present invention, the second layer is a same level layer with the plurality of touch electrodes.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A touch display device comprising:
   a display panel including a plurality of data lines, a plurality of gate lines, a plurality of touch electrodes, and a plurality of touch routing lines which are disposed on a substrate, wherein the display panel further includes an active area configured to display an image, and a non-active area which is outer to the active area; and
   a touch circuit configured to sense at least one of the plurality of touch electrodes,
   wherein the display panel further includes:
      a plurality of subpixels including a light emitting element including a pixel electrode, a light emitting layer, a common electrode, and a driving transistor to drive the light emitting element; and
      an encapsulation layer disposed on the common electrode,
   wherein the plurality of touch electrodes are disposed on the encapsulation layer, and the plurality of touch routing lines are disposed along an inclined surface of the encapsulation layer, and electrically connected to a plurality of touch pads disposed in the non-active area,
   wherein the touch circuit includes an operational amplifier having a first input terminal for inputting a reference voltage, a second input terminal connected to a sensing target touch electrode, and an output terminal for outputting an output voltage, and
   wherein a common voltage applied to the common electrode and the reference voltage inputted to the first input terminal of the operational amplifier are synchronized with each other.

2. The touch display device of claim 1, wherein when an operation mode of the touch display device is a pen sensing mode,
   the touch circuit detects a pen signal output from a pen through the sensing target touch electrode, and
   the reference voltage and the common voltage are modulation signals having frequencies and phases corresponding to each other.

3. The touch display device of claim 2, wherein a driving voltage applied to the driving transistor is a modulation signal having a frequency and a phase corresponding to the reference voltage and the common voltage.

4. The touch display device of claim 2, wherein the pen signal is in antiphase with the reference voltage and the common voltage.

5. The touch display device of claim 2, wherein the pen signal is in-phase with the reference voltage and the common voltage.

6. The touch display device of claim 1, wherein the plurality of touch electrodes include first touch electrodes to which a driving signal is applied and second touch electrodes to detect a sensing signal,
wherein when an operation mode of the touch display device is a finger sensing mode, the touch circuit applies the driving signal to one or more first touch electrodes among the first touch electrodes and detects the sensing signal through the second input terminal of the operational amplifier electrically connected to the second touch electrode corresponding to a sensing target touch electrode among the second touch electrodes, and
wherein each of the reference voltage and the common voltage is a DC voltage.

7. The touch display device of claim 6, wherein the driving signal applied to the driving transistor is a DC voltage.

8. The touch display device of claim 6, wherein the driving signal is a modulation signal having a predetermined frequency.

9. The touch display device of claim 1, wherein when an operation mode of the touch display device is a finger sensing mode, the touch circuit applies the driving signal to a sensing target touch electrode among the plurality of touch electrodes and detects a sensing signal through the second input terminal of the operational amplifier electrically connected to the sensing target touch electrode to which the driving signal is applied, and
wherein the reference voltage and the common voltage are modulation signals having frequency and phase corresponding to each other.

10. The touch display device of claim 9, wherein a driving voltage applied to the driving transistor is a modulation signal having a frequency corresponding to the reference voltage and the common voltage.

11. The touch display device of claim 1, wherein the plurality of data lines overlap the common electrode, and the plurality of touch electrodes overlap the common electrode.

12. The touch display device of claim 11, wherein the display panel further comprises one or more dams disposed in the non-active area and disposed between the touch pad and the active area, wherein the one or more dams are formed higher than the touch pad, and
wherein a touch routing line among the plurality of touch routing lines descends along an inclined surface of the encapsulation layer, crosses over the one of more dams, and is electrically connected to the touch pad.

13. The touch display device of claim 1, wherein each of the common voltage applied to the common electrode and the reference voltage inputted to the first input terminal of the operational amplifier is a modulation signal whose voltage is variable and has a frequency and a phase corresponding to each other.

14. The touch display device of claim 1, wherein the common voltage applied to the common electrode and the reference voltage inputted to the first input terminal of the operational amplifier are synchronized to a DC voltage.

15. The touch display device of claim 1, wherein the first input terminal of the operational amplifier is directly connected to the common electrode or electrically connected to the common electrode through a synchronization line.

16. The touch display device of claim 1, further comprising:
a common voltage source configured to supply the common voltage to the common electrode; and
a reference voltage source configured to supply the reference voltage to the first input terminal of the operational amplifier.

17. The touch display device of claim 1, further comprising a voltage source commonly connected to the common electrode and the first input terminal of the operational amplifier.

18. The touch display device of claim 1, wherein the common electrode is electrically insulated from the plurality of touch electrodes in the active area and is electrically connected to the touch circuit that is electrically connected to the plurality of touch electrodes.

19. The touch display device of claim 1, wherein a polarity of the first input terminal and a polarity of the second input terminal of the operational amplifier are opposite.

20. The touch display device of claim 1, wherein each of the plurality of touch electrodes is a mesh type including an open area, and the open area positionally corresponds to a light emitting region of the subpixel,
wherein at least two touch electrodes of the plurality of touch electrodes are connected by a connection line formed on a different level layer from the at least two touch electrodes,
wherein a touch routing line among the plurality of touch routing lines includes multiple layers including a first layer and a second layer,
wherein the first layer is a same level layer with the connection line, and
wherein the second layer is a same level layer with the plurality of touch electrodes.

21. A driving method of a touch display device, the method comprising:
detecting a sensing signal from a sensing target touch electrode among a plurality of touch electrodes disposed on a display panel; and
sensing a finger touch or a pen touch based on the sensing signal,
wherein each of a plurality of subpixels disposed in the display panel includes a light emitting element including a pixel electrode, a light emitting layer, a common electrode, and a driving transistor for driving the light emitting element, and
wherein when the sensing signal is input to a touch circuit from the sensing target touch electrode, a reference voltage is input to the touch circuit, and the reference voltage is synchronized with a common voltage applied to the common electrode.

22. The driving method of claim 21, wherein the display panel further includes a plurality of touch routing lines, an active area configured to display an image, a non-active area which is outer to the active area, and an encapsulation layer disposed on the common electrode, and
wherein the plurality of touch electrodes are disposed on the encapsulation layer, and the plurality of touch routing lines are disposed along an inclined surface of the encapsulation layer, and electrically connected to a plurality of touch pads disposed in the non-active area.

23. The driving method of claim 21, wherein the common voltage applied to the common electrode and the reference voltage inputted to a first input terminal of an operational amplifier are modulation signals whose voltages are variable and have a frequency and a phase corresponding to each other.

24. The driving method of claim 21, wherein the common voltage applied to the common electrode and the reference voltage inputted to a first input terminal of an operational amplifier are DC voltages.

25. A touch circuit comprising:
an operational amplifier electrically connected to a sensing target touch electrode among a plurality of touch electrodes arranged on a display panel;
an integrator electrically connected to an output terminal of the operational amplifier; and
an analog-to-digital converter configured to convert an integral value output from the integrator into a digital value,
wherein the operational amplifier includes a first input terminal for inputting a reference voltage, a second input terminal connected to the sensing target touch electrode, and an output terminal for outputting an output voltage,
wherein the reference voltage inputted to the first input terminal of the operational amplifier is synchronized with a common voltage applied to the display panel, and
wherein the common voltage is a voltage applied to a common electrode among a pixel electrode, a light emitting layer, and the common electrode included in a light emitting element in each subpixel arranged in the display panel.

26. The touch circuit of claim 25, wherein the first input terminal of the operational amplifier is electrically connected to the common electrode.

27. The touch circuit of claim 25, wherein the plurality of touch electrodes are disposed on a encapsulation layer of the display panel, and a plurality of touch routing lines are disposed along an inclined surface of the encapsulation layer, and electrically connected to a plurality of touch pads disposed in a non-active area of the display panel.

28. A touch display device comprising:
a display panel including a plurality of data lines, a plurality of gate lines, a plurality of subpixels and a plurality of touch electrodes; and
a touch circuit configured to sense at least one of the plurality of touch electrodes,
wherein each of the plurality of subpixels includes a light emitting element including a pixel electrode, a light emitting layer and a common electrode, and a driving transistor to drive the light emitting element,
wherein the touch circuit includes an operational amplifier having a first input terminal for inputting a reference voltage, a second input terminal connected to a sensing target touch electrode, and an output terminal for outputting a output voltage, and
wherein the first input terminal of the operational amplifier is electrically connected to the common electrode of the light emitting element.

29. The touch display device of claim 28, wherein the display panel further includes a plurality of touch routing lines, an active area configured to display an image, a non-active area which is outer to the active area, and an encapsulation layer disposed on the common electrode, and
wherein the plurality of touch electrodes are disposed on the encapsulation layer, and the plurality of touch routing lines are disposed along an inclined surface of the encapsulation layer, and electrically connected to a plurality of touch pads disposed in the non-active area.

30. A touch display device comprising:
a display panel including a plurality of subpixels and a plurality of touch electrodes, wherein each of the plurality of subpixels includes a light emitting element, a common electrode, and a driving transistor to drive the light emitting element; and
a touch circuit configured to sense at least one of the plurality of touch electrodes,
wherein the touch circuit includes an operational amplifier having a first input terminal for inputting a reference voltage, a second input terminal connected to a sensing target touch electrode, and an output terminal for outputting an output voltage, and
wherein a common voltage applied to the common electrode and the reference voltage inputted to the first input terminal of the operational amplifier have the same frequency and the same phase.

31. The touch display device of claim 30, wherein the display panel further includes a plurality of touch routing lines, an active area configured to display an image, a non-active area which is outer to the active area, and an encapsulation layer disposed on the common electrode, and
wherein the plurality of touch electrodes are disposed on the encapsulation layer, and the plurality of touch routing lines are disposed along an inclined surface of the encapsulation layer, and electrically connected to a plurality of touch pads disposed in the non-active area.

* * * * *